(12) United States Patent
Ross

(10) Patent No.: US 10,831,251 B1
(45) Date of Patent: Nov. 10, 2020

(54) AUGMENTED POWER MONITORING SWITCHING ASSEMBLY

(71) Applicant: Amazon Technologies, Inc., Reno, NV (US)

(72) Inventor: Peter George Ross, Olympia, WA (US)

(73) Assignee: Amazon Technologies, Inc., Seattle, WA (US)

( * ) Notice: Subject to any disclaimer, the term of this patent is extended or adjusted under 35 U.S.C. 154(b) by 557 days.

(21) Appl. No.: 14/204,855

(22) Filed: Mar. 11, 2014

(51) Int. Cl.
*G06F 1/30* (2006.01)
*G06F 1/26* (2006.01)

(52) U.S. Cl.
CPC . *G06F 1/30* (2013.01); *G06F 1/26* (2013.01)

(58) Field of Classification Search
CPC ..... G06F 1/00; G06F 1/04; G06F 1/12; G06F 1/26; G06F 1/30; G06F 1/32; G06F 11/30; G06F 15/16
See application file for complete search history.

(56) References Cited

U.S. PATENT DOCUMENTS

| | | | | |
|---|---|---|---|---|
| 5,379,266 A * | 1/1995 | Russell | ................ | G11C 7/005 365/125 |
| 5,390,326 A * | 2/1995 | Shah | ................ | G06F 11/2007 370/222 |
| 5,491,463 A * | 2/1996 | Sargeant | ................ | H04B 3/542 340/12.37 |
| 6,016,045 A * | 1/2000 | Thomas | ................ | H02J 9/061 180/68.5 |
| 7,478,251 B1 * | 1/2009 | Diab | ................ | G06F 1/189 307/38 |
| 8,595,515 B1 * | 11/2013 | Weber | ................ | G06F 9/5094 713/300 |
| 8,595,550 B1 * | 11/2013 | Heath | ................ | G06F 11/2015 714/14 |
| 9,438,845 B2 * | 9/2016 | Herzel | ................ | H04N 5/765 |

(Continued)

OTHER PUBLICATIONS

How Stuff Works, "How Power-line Networking Works", Jeff Tyson, downloaded Dec. 20, 2013, pp. 1-6.

(Continued)

*Primary Examiner* — Chun Cao
(74) *Attorney, Agent, or Firm* — Robert C. Kowert; Kowert, Hood, Munyon, Rankin & Goetzel, P.C.

(57) ABSTRACT

A switching assembly selectively routes power received from upstream power distribution systems over power transmission lines to a downstream electrical load using data signals communicated to the assembly from the power distribution systems over the power transmission lines. The switching assembly monitors information in the data signals to determine conditions in the upstream power distribution systems. The switching assembly can use the conditions in the power distribution systems and monitored power feed characteristics of power received at the switching assembly to determine whether to command a switching mechanism to switch the power feed routed to the load. Power system conditions can be used to adjust tolerance thresholds against which power feed characteristics are compared to determine whether to command a switch. The switching assembly can include an interposer device that controls the switching mechanism based on analysis of data signals received over the power transmission line.

20 Claims, 10 Drawing Sheets

(56) References Cited

U.S. PATENT DOCUMENTS

| | | | |
|---|---|---|---|
| 9,570,253 B1* | 2/2017 | Hamilton | H01H 11/0062 |
| 2003/0034693 A1* | 2/2003 | Wareham | H02J 9/06 |
| | | | 307/23 |
| 2003/0158677 A1* | 8/2003 | Swarztrauber | G01D 4/008 |
| | | | 702/62 |
| 2004/0164849 A1* | 8/2004 | Alvarez | H04L 12/66 |
| | | | 340/2.9 |
| 2005/0141154 A1* | 6/2005 | Consadori | H02J 3/005 |
| | | | 361/62 |
| 2005/0200205 A1* | 9/2005 | Winn | H02J 9/062 |
| | | | 307/64 |
| 2009/0172453 A1* | 7/2009 | Dishman | G06F 1/263 |
| | | | 713/340 |
| 2009/0212630 A1* | 8/2009 | Flegel | H02J 9/06 |
| | | | 307/64 |
| 2010/0036629 A1* | 2/2010 | Semmelrodt | G01P 3/48 |
| | | | 702/66 |
| 2011/0054707 A1* | 3/2011 | Batzler | G06Q 10/06 |
| | | | 700/286 |
| 2011/0130982 A1* | 6/2011 | Haag | G01R 22/063 |
| | | | 702/62 |
| 2012/0074794 A1* | 3/2012 | Morales | G06F 1/26 |
| | | | 307/147 |
| 2012/0104848 A1* | 5/2012 | Lathrop | H02J 3/381 |
| | | | 307/29 |
| 2012/0181869 A1* | 7/2012 | Chapel | H02J 9/06 |
| | | | 307/64 |
| 2013/0062949 A1* | 3/2013 | Yan | H02J 9/061 |
| | | | 307/64 |
| 2013/0162035 A1* | 6/2013 | Sullivan | H02H 7/261 |
| | | | 307/18 |
| 2013/0334886 A1* | 12/2013 | Qu | H02J 3/381 |
| | | | 307/69 |
| 2014/0019084 A1* | 1/2014 | Rolew | G01D 5/145 |
| | | | 702/150 |
| 2014/0133092 A1* | 5/2014 | Leckelt | H05K 7/20745 |
| | | | 361/679.48 |
| 2014/0320011 A1* | 10/2014 | Hegarty | H05B 33/0842 |
| | | | 315/86 |
| 2015/0084420 A1* | 3/2015 | Dickerson | H02J 9/06 |
| | | | 307/29 |

OTHER PUBLICATIONS

"Power Line Working", downloaded Dec. 20, 2013, pp. 1-2.
U.S. Appl. No. 15/882,944, filed Jan. 29, 2018, Paul Andrew Churnock et al.

* cited by examiner

AUGMENTED POWER MONITORING SWITCHING ASSEMBLY

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

From time to time, elements in the power chain providing power to electrical systems fail or shut down. For example, if a power distribution unit that provides power to electrical systems is overloaded, an overload protection device in the power distribution unit (for example, a fuse or breaker) may trip, shutting down all of the electrical systems that are receiving power through that line of the power distribution unit.

Primary power systems for computer systems in operation typically need to be maintained or reconfigured from time to time. Some data centers, for example, have "single threaded" distribution via the electrical power supply to the floor and/or to the rack, and in which maintenance can only be performed when the components using power in the data center, such as servers, are shut-off. The down-time associated with maintenance and reconfiguration of primary power systems in a data center may result in a significant loss in computing resources. In some critical systems such as hospital equipment and security systems, down-time may result in significant disruption and, in some cases, adversely affect health and safety.

Some data centers include systems and components that provide redundant power support for computing equipment. Such systems and components may include one or more back-up power distribution systems that may provide secondary power support to such computing equipment. In some systems, an automatic transfer switch ("ATS") provides switching of a source of power, routed to a downstream electrical load, from a primary power distribution system to a secondary (e.g., back-up) power distribution system. In a typical system, the automatic transfer switch automatically switches the computing equipment to the secondary system upon detecting a fault in the primary power received from the primary system. To maintain the computing equipment in continuous operation, the automatic transfer switch may need to make the transfer to secondary power system rapidly (for example, within about 16 milliseconds).

In some systems, an ATS may determine whether to switch between power systems by monitoring one or more characteristics of power received from a power distribution system at the ATS and switching to power from another power system if the power characteristics exceed certain thresholds. For example, an ATS may monitor voltage of a primary power feed received from a primary power system and switch to a back-up power system if a disturbance is detected in the primary power feed voltage. Such switching operations may impose power support burdens on one or more secondary power systems. Additionally, switching operations may create a risk of power support loss on the computing equipment supported by the ATS.

Figure 1:
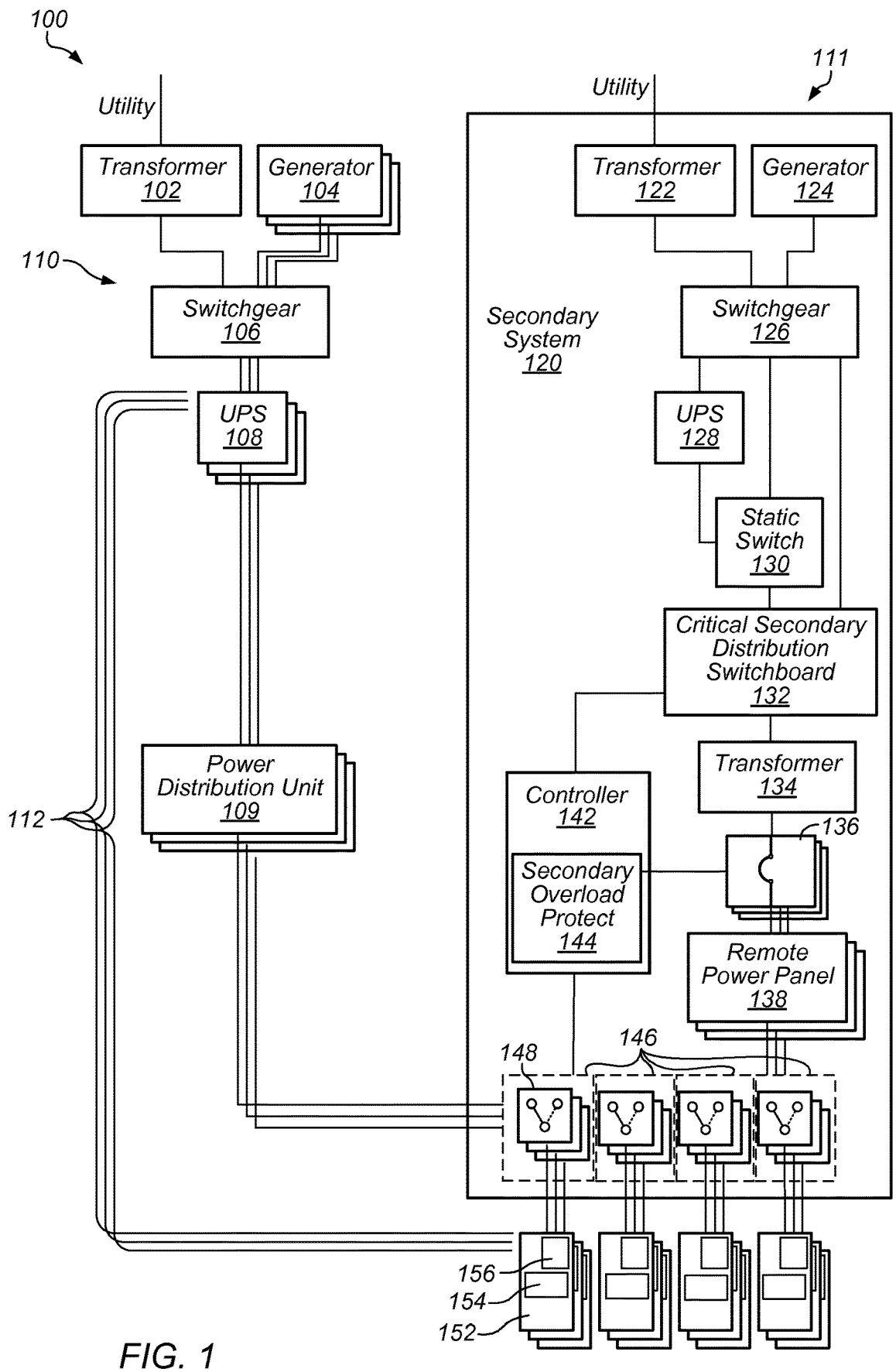
FIG. 1 is a block diagram illustrating a data center having a secondary power system that is enabled using switching assemblies that include automatic transfer switches, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods for acquiring and using information about an electrical power distribution system to manage selective routing of power from one or more power distribution systems to an electrical load are described. According to one embodiment, a data center includes a switching assembly that switches from routing a primary power feed from a primary power system to one or more sets of computer systems to routing a secondary power feed from a secondary power system to the one or more sets of computer systems based at least in part upon information included in one or more data signals received at the switching assembly from at least one power component of the primary power system over the power transmission line used to supply the primary power feed to the switching assembly.

According to one embodiment, an apparatus includes a switching controller device that receives power from an upstream power component of a power system over a power transmission line and commands a switching mechanism to selectively route the power to a downstream computer system based at least in part upon information recovered from a data signal received over the power transmission line. The controller device includes a transceiver module that receives data signals from the upstream power component over the power transmission line, an analysis module that processes the received data signal to recover information associated with at least a portion of the power system, and a controller module that commands the switching mechanism based at least in part upon the information.

According to one embodiment, a method includes receiving a data signal from an upstream power component of the upstream power system over the power transmission line, processing the data signal to determine a current condition of a portion of the upstream power system, and commanding a switching mechanism to selectively route power received over the power transmission line to a downstream electrical load based at least in part upon the determined current condition of the portion of the upstream power system. The data signal includes information indicating the current condition of a portion of the upstream power system. The method can be performed by a by a computing device configured to route the power received from the upstream power system over the power transmission line to the downstream electrical load.

As used herein, one component in a power distribution system is "downstream" from another component in the power distribution system if the one component receives power from the other component or is at a lower level in the power distribution system than the other component. For example, a floor PDU may be downstream from a UPS, or a power supply unit in a server may be downstream from a rack PDU.

As used herein, a "power component", in the context of a power distribution system, means a component, device, or system that supplies power to one or more other components, devices, systems, or loads in a system. Examples of power components in a power distribution system include a power supply unit, a power supply module, a rack PDU, a floor PDU, a UPS, a power bus, a backfeed apparatus, a distribution panel, a generator, or a transformer.

As used herein, "power transmission line" means a line that transmits power from one component to another component. Examples of power transmission lines include conductors that carry power from a UPS to a floor PDU, conductors that carry power from a floor PDU to an automatic transfer switch ("ATS"), conductors that carry power from an automatic transfer switch to a rack PDU, and conductors that carry power from a rack PDU to a server power supply unit. Power transmission lines may have any form, such as a cable, bus bar, or other conductive member or device.

As used herein, "signal" includes any signal, message, pulse, wave, or combination thereof, that can provide information from one element to another element. A signal may serve to indicate, identify, inform, direct, instruct, command, or warn. A signal may be a discrete set of information (for example, a sequence of characters in a message), continuous (such as a wave), periodic, or a combination thereof. In some cases, a signal is a message having a predetermined format or arrangement, such as a sequence of characters (for example, a message representing the string PWRID0002436). In some embodiments, a signal includes an identifying address of the device sending the signal. In some embodiments, a signal includes information about characteristics or conditions of some or all of a component, device, or system, including information indicating a current state of such characteristics or conditions.

As used herein, one component in a power distribution system is "upstream" from another component in the power distribution system if the one component supplies power to the other component or is at a higher level in the power distribution system than the other component. For example, a UPS may be upstream from a floor PDU, or a rack PDU may be upstream from a power supply unit for a server.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, and isolation.

As used herein, "floor power distribution unit" refers to a power distribution unit that can distribute electrical power to various components in a computer room. In certain embodiments, a floor power distribution unit includes a transformer. In one embodiment, a floor power distribution unit includes a k-rated transformer. A power distribution unit may be housed in an enclosure, such as a cabinet.

As used herein, "rack power distribution unit" refers to a power distribution unit that can be used to distribute electrical power to various components in a rack. A rack power distribution may include various components and elements, including wiring, bus bars, connectors, and circuit breakers. In some embodiments, a rack power distribution unit may distribute power to only some of the electrical systems in a rack. In some embodiments, a single rack includes two or more rack power distribution units that distribute power to different sets of electrical systems in the rack. For example, one rack may include a left rack power distribution unit that distributes power to half of the servers in the rack, and a right rack power distribution unit that distributes power to the other half of the servers in the rack.

As used herein, a "cable" includes any cable, conduit, or line that carries one or more conductors and that is flexible over at least a portion of its length. A cable may include a connector portion, such as a plug, at one or more of its ends.

As used herein, "computer room" means a room of a building in which computer systems, such as rack-mounted servers, are operated.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "primary power" means any power that can be supplied to an electrical load, for example, during normal operating conditions. A power distribution system (also referred to herein as a "power system") that distributes primary power may be referred to as a primary power system.

As used herein, a "rack" means a rack, container, frame, or other element or combination of elements that can contain or physically support one or more computing devices.

As used herein, "secondary power" means power that can be supplied to an electrical load in addition to, upon the failure of, or as a substitute for, primary power to the load. In some embodiments, secondary power includes reserve power supplied from one or more reserve power sources, back-up power sources, some combination thereof, or the like.

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a secondary power system may provide secondary power support to an electrical load by providing a secondary power feed that can be selectively routed to the load by a transfer switch that is downstream of the secondary power system and upstream of the load, where the transfer switch may selectively route the secondary power feed or a primary power feed to the load based at least in part upon one or more conditions associated with the primary power feed.

In various embodiments, various power components in one or more power distribution systems that can send/receive signals to/from various upstream/downstream power component over power transmission lines communicate with one or more switching assemblies that selectively route power from various power distribution systems to one or more downstream electrical loads. The signals may include data signals from a given power distribution system that include information about one or more portions of that power distribution system. For example, the signals may include identifying information for one or more power components, information indicating characteristics of power being supplied or received by the power components, or conditions in a portion of the power distribution system. The information may include information indicating current characteristics or conditions.

In various embodiments, a switching assembly can communicate with one or more power components of one or more power distribution systems via signals transmitted and received over one or more power transmission lines used to provide power support to one or more computer systems downstream of the switching assembly. The switching assembly can monitor data signals received from various power components of various power distribution systems and utilize information included therein to manage switching operations of one or more switching mechanisms included in the switching assembly. One or more power components may monitor communications received from a switching assembly to determine whether switching operations have been performed and may preclude power-down of some or all portions of a power distribution system if the switching assembly has not switched away from the power distribution system. One or more computing devices may perform various communication functions with regard to the switching assemblies, including receiving operation data, event logs, providing firmware override commands to the switching assemblies, pushing firmware and software updates to the switching assemblies, etc.

FIG. 1 is a block diagram illustrating one embodiment of a data center having a secondary power system that is enabled using switching assemblies that include automatic transfer switches. In various embodiments, a switching assembly may include various systems and components that manage switching operations of one or more switching mechanisms, which may include at least a part of automatic transfer switches, such as described below relative to FIGS. 2-10. Data center 100 includes rack 152, primary power side 110, and secondary power side 111. Primary power side 110 includes transformer 102, generators 104, and switchgear 106, and primary power systems 112. Sets of computer systems 154 in racks 152 may perform computing operations in data center 100. Computer systems 154 may be, for example, servers in a server room of data center 100. Computer systems 154 in racks 152 may each receive power from one of primary power systems 112. In one embodiment, each of primary power systems 112 corresponds to, and provides power to, the servers in one room in data center 100. In one embodiment, each of primary power systems 112 corresponds to, and provides power to, one rack system 152 in data center 100.

Primary power systems 112 each include UPS 108 and floor power distribution unit 110. Floor power distribution unit 110 provides power to various racks 152. In some embodiments, floor power distribution unit 110 includes a transformer that transforms the voltage from switchgear 106. Each of rack 152 may include a rack power distribution unit 156. Rack power distribution units 156 may distribute power to computer systems 154.

Transformer 102 is coupled to a utility feed. The utility feed may be a medium voltage feed. In certain embodiments, the utility feed is at a voltage of about 13.5 kilovolts or 12.8 kilovolts at a frequency of about 60 Hz. Generators 104 may provide power to primary power systems 112 in the event of a failure of utility power to transformer 102. In one embodiment, one of generators 104 provides back-up power for each of primary power systems 112. UPS 110 may provide uninterrupted power to racks 152 in the event of a power failure upstream from UPS 108.

Secondary power system 120 may provide secondary power for all of the computer systems 154 supplied by primary power systems 112. In some embodiments, secondary power system 120 provides 2N power support redundancy to one or more of the computer systems 154. In some embodiments, secondary power system 120 includes a reserve power system, where secondary power system 120 provides N+1 power support redundancy to one or more of the computer system 154. In some embodiments, secondary power system 120 is powered up at all times during operation of data center 100. Secondary power system 120 may be passive until a failure of one or more components of primary power side 110, at which time secondary power system 120 may become active.

For illustrative purposes, three primary power systems are shown in FIG. 1 (for clarity, details of only the front primary power system 112 are shown). The number of primary power systems 112 on primary power side 110 may vary, however. In certain embodiments, a primary power side may include only one primary power system. In addition, the number of power distribution units, UPSs, switchgear apparatus may vary from embodiment to embodiment (and, within a given embodiment, from system to system). In some embodiments, primary power system 112 includes many floor power distribution units 110. As another example, a primary power system may have one UPS that can supply power to many floor power distribution units.

Secondary power system 120 includes transformer 122 and generator 124. Transformer 122 may supply power to switchgear 126. Critical secondary distribution board 132 may receive power from switchgear 126. Power from switchgear 126 may pass through UPS 128. Static switch 130 is provided between UPS 128 and critical secondary distribution switchboard 132. Static switch 130 may provide for bypass of UPS 128 (for example, during maintenance of UPS 128).

Secondary power system 120 also includes transformer 134 and remote power panel 138. Transformer 134 may transform power from critical secondary distribution switchboard 132 and supply power to remote power panels 138. Remote power panels 138 may distribute power to servers 154 in racks 152. In one embodiment, each of remote power panels 138 of secondary power system 120 corresponds to one of floor power distribution units 110 of one of primary power systems 112. For example, if a floor power distribution unit distributes primary power to all of the computer systems in a rack, a remote power panel may distribute secondary power to all of the computer systems in that rack.

Secondary power system 120 also includes an array of switching assemblies 146. Each switching assembly may include one or more automatic transfer switches 148. Switching assemblies 146 may control switching of power to computer systems 154 between primary power side 110 and secondary power side 120, via automatic transfer switches 148. Switches 148 may automatically switch power from one of primary power systems 112 to secondary power system 120. In some embodiments, one automatic switching assembly is provided for each rack system in a computer room. Thus, an automatic transfer switch included in a switching assembly may switch input power to the rack between one of floor distribution units 109 and one of remote power panels 138. In some embodiments, an automatic transfer switch is provided for each half of a rack system. In still another embodiment, automatic transfer switches may be provided at the server level. In certain embodiments, a secondary power system includes manual transfer switches. Manual transfer switches may be used, for example, to enable maintenance operations to be performed.

Although in the embodiment shown in FIG. 1, power to servers is switched between primary power and secondary power, in some embodiments, a data center may not have automatic transfer switches to switch between primary power and secondary power. In some embodiments, for example, servers in a rack system (such as servers 154 in racks 152) may be dual-supplied by two power systems or include power supplies that accept two or more power source inputs. A server may be sourced from two power feeds without an automatic transfer switch. In some embodiments, a redundant power system for servers in a data center may operate in an active-active failover configuration. In other embodiments, a redundant power system for servers in a data center may operate in an active-passive failover configuration.

Secondary power system 120 further includes controller 142. Controller 142 may serve various control functions in secondary power system 120. In some embodiments, controller 142 may control some or all of automatic transfer switches 148 in secondary power system 120. Controller 142 includes secondary overload protect circuit 144. In certain embodiments, controller 142 includes at least one programmable logic controller. The programmable logic controller may control some or all of the switching in or among devices in secondary power system 120.

In some embodiments, each switching assembly 146 is at least partially internally controlled. A switching assembly may include fault detection circuitry such that when a fault condition is detected in the primary power input, the automatic transfer switch included in the switching assembly automatically switches to secondary power. Thus, for the computer systems coupled to the switch, in the event of a failure in any of the elements on primary power side 100 upstream from an automatic transfer switch 148, including floor power distribution unit 109, UPS 108, or switchgear 106, the automatic transfer switch may transfer input power from primary power to secondary power. Following such transfer, the computer systems that have been switched to secondary power may receive power from remote power panel 138 of secondary power system 120. In addition, the computer systems that have been switched to secondary power may be protected against power interruption by UPS 128. In one embodiment, failover from primary power to secondary power is carried out within about 8 to about 20 milliseconds.

In some embodiments, a switching assembly includes fault detection circuitry that monitors power feed characteristics of various power feeds received at the switching assembly and determines whether a fault condition in a power feed, a power system from which it is received, etc., based at least in part upon the monitored power feed characteristics. For example, a switching assembly 146 may include one or more sensors that may monitor one or more characteristics or conditions associated with a power feed (hereinafter "power feed characteristics") received from a primary power system 110 via a power transmission line. Power feed characteristics that may be monitored by the sensors may include voltage, current, waveform patterns of one or more of the above, some combination thereof, and the like. In some embodiments, the switching assembly may respond to a determination that one or more power feed characteristics at least meets one or more predetermined thresholds by determining that the switch 148 included in the switching assembly 146 is to switch from the monitored power feed to another power feed from another power system. For example, switching assembly 146 may monitor a voltage of a primary power feed received from a primary power system 110 and may respond to a determination that a voltage in the primary power feed at least meets one or more threshold values, including a low voltage threshold indicating voltage drop in the primary power feed, by commanding switch 148 to switch from the primary power system 110 to the secondary power system 120.

In some embodiments, managing switching operations at a switching assembly 146 based on power feed characteristics may impose additional burdens on the secondary power system 120. For example, secondary power system 120 may be oversubscribed to racks 152, and switching more than a limited number of racks 152 to secondary power system may burden the secondary power system 120 with a total load requirement that exceeds the capability of the secondary power system 120 to supply secondary power. In such a condition, an overload condition may be determined, and secondary overload unit 144 may shut down one or more racks 152 to protect the secondary power system 120. An overload condition may develop where multiple switches 148 switch to secondary power system 120 based upon an erroneous determination of a fault condition in the primary power feed. For example, power quality in the primary power feed may be at least partially degraded, where certain amounts of "noise" are present in the voltage of the power feed. Such noise may be interpreted by a switching assembly as an indication of a fault condition, although a true fault may not be present in the primary power system supplying the primary power feed. For example, voltage noise may be at least partially caused by introduction of an electrically "noisy" device into a computing room that introduces noise into a voltage of a power feed. In another example, various anomalies, including harmonic distortions and waveform anomalies, may be caused in a power feed by interactions of various devices in a data center 100. In some embodiments, various anomalies, power feed degradations, noise, etc. in a power feed does not necessitate switching away from the power feed, as the various systems and components in a data center can tolerate such anomalies, power feed degradations, noise, etc. But a switching assembly 146, based upon monitoring the power feed characteristics, may be sufficiently sensitive to power feed anomalies, noise, etc. to trigger switching, although such switching is not necessary. As a result, switching assembly 146 may switch a rack 152 to secondary power system 120 when such switching is not necessary to maintain uninterrupted power support to a rack 152, thereby imposing unnecessary power support burden on secondary power system 120. As a result, where one or more racks 152 a switched to secondary power system 120 unnecessarily, the capability of the secondary power system 120 to provide secondary power support to one or more racks 152 for which switching away from a primary power. In some embodiments, such burdens are mitigated through managing switching operations at a switching assembly 146 based on, in addition or in alternative to power feed characteristics, characteristics or conditions of one or more portions of an upstream power distribution system that are communicated to the switching assembly via information included in data signals communicated over the power transmission line carrying power from the power distribution system to the switching assembly.

Figure 2:
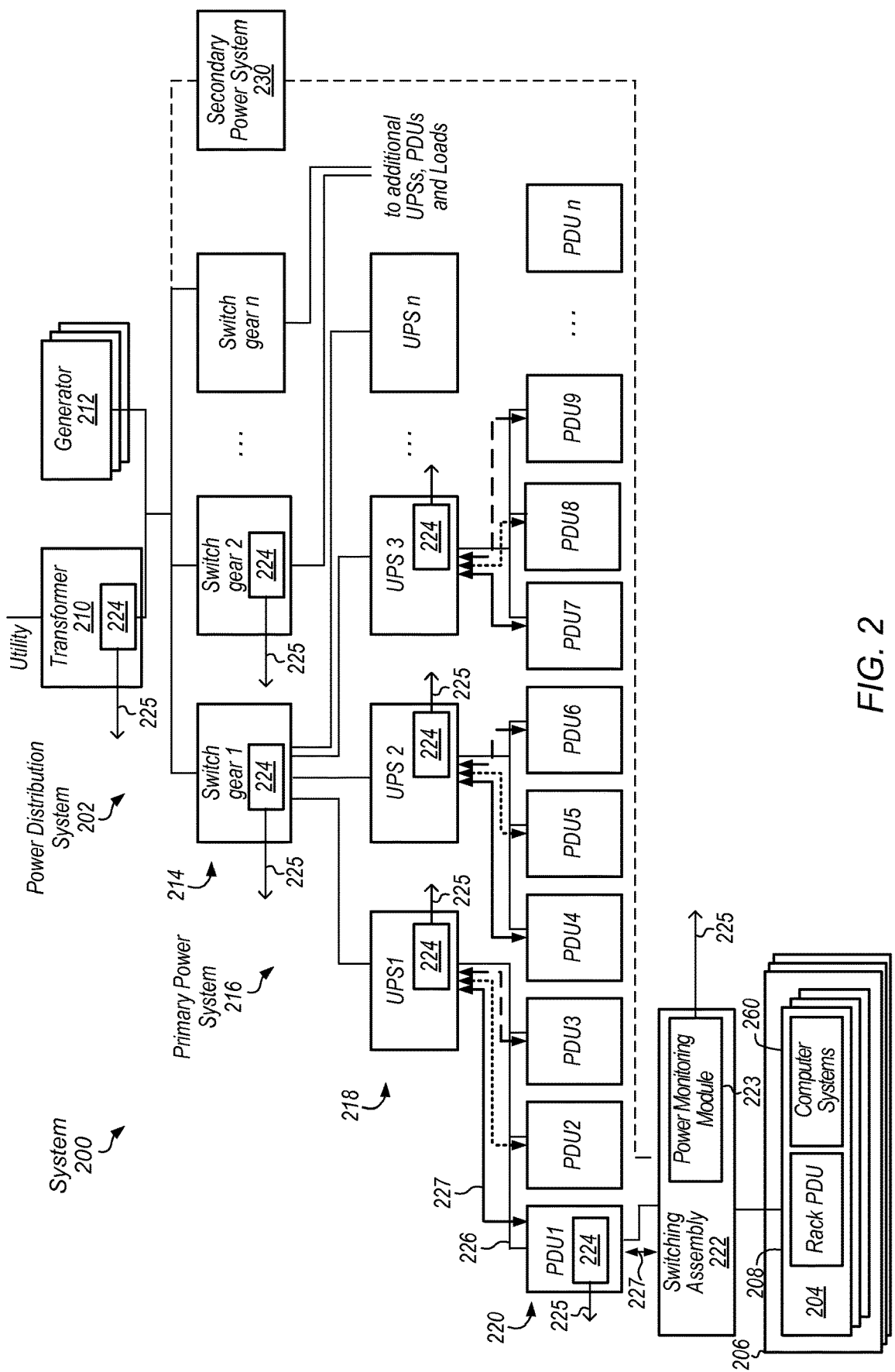
FIG. 2 is a block diagram illustrating a power distribution system with communication between power components in the system and a switching assembly that selectively routes power from various power components to a downstream electrical load, according to some embodiments.

FIG. 2 is a block diagram illustrating a power distribution system with communication between power components in the system and a switching assembly that selectively routes power from various power components to a downstream electrical load, according to some embodiments. System 200 includes power distribution system 202 and electrical loads 204. In one embodiment, system 200 is a data center. Electrical loads 204 may include, for example, computing devices, rack-mounted servers, network control devices, power supply units, air moving devices, and mass storage devices. Electrical loads 204 may be supported in racks 206. Electrical loads 204 may perform various functions in a data center, such as data storage or network services. In one embodiment, electrical systems 204 are servers in a server room of a data center.

Each of electrical loads 204 includes power supply unit 208, which may include a rack power distribution unit ("PDU"). Power supply unit 208 may supply power to various electrical components, such as integrated circuits, central processing units, solid state memory, and hard disk drives in electrical loads 204. Electrical loads 203, in some embodiments, include one or more computer systems 260, which may include one or more rack-mounted servers.

Power distribution system 202 includes transformer 210, generators 212, switchgear apparatus 214, and primary power systems 216. Each of primary power systems 216 includes UPS 218 and one or more power distribution units ("PDUs") 220.

Electrical loads 204 in racks 206 may each receive power from one of primary power systems 216. In one embodiment, each of primary power systems 216 corresponds to, and provides power to, the servers in one room in a data center. In one embodiment, each of primary power systems 216 corresponds to, and provides power to, one rack system in a data center. In FIG. 2, for the sake of clarity, electrical systems 204 are shown coupled to only one of PDUs 220. Electrical systems may, however, be coupled to any or all of PDUs 220 in a data center.

Power distribution units 220 may be floor power distribution units. In some embodiments, power distribution unit 220 includes a transformer that transforms the voltage from switchgear apparatus 214. Each of racks 206 may include one or more rack power distribution units 208. The rack power distribution units 208 may distribute power to computer systems 260.

Transformer 210 is coupled to a utility feed. The utility feed may be a medium voltage feed. In certain embodiments, the utility feed is at a voltage of about 23.5 kilovolts or 12.8 kilovolts at a frequency of about 60 Hz. Generators 204 may provide power to primary power systems 206 in the event of a failure of utility power to transformer 210. In one embodiment, one of generators 212 provides back-up power for each of primary power systems 216.

UPS 218 may provide uninterrupted power to racks 206 in the event of a power failure upstream from UPS 218. In certain embodiments, a UPS receives three-phase power from a transformer. The UPS may supply three-phase power to a floor power distribution unit.

PDU power may be any suitable voltage. In one embodiment, electrical power is about 208 V. In one embodiment, electrical power is about 230 V. In some embodiments, different electrical systems 204 may operate on different phases of a primary power system. Each of the legs may correspond to one phase of the input power. In one embodiment, each leg operates at a voltage between about 220 volts to about 260 volts.

In operation of system 200, receptacles in rack PDU 208 may be used to supply power to electrical systems in rack 206, such as servers. Computer systems 260 may be coupled to rack PDU 208 by way of cables. In addition, electrical loads 204 may be coupled to switching assembly 222 by way of one or more power transmission lines, which may include one or more cables, power buses, some combination thereof, or the like.

Each of the legs in rack PDU 208 may include a breaker. In one embodiment, each breaker is a 30 A/32 A single pole MCB. Breakers may be located such that they can be accessed when server racks are in-line (e.g., at the top of rack power distribution unit 208). In one embodiment, power is provided to a rack PDU by way of an 8 AWG/6 mm$^2$ 5 core cable and a 30 A NEMA/32 A IEC309 3Ph+N+E Plug.

Secondary power system 230 may provide secondary power for any or all of the electrical systems 204 supplied by primary power systems 216. In some embodiments, secondary power system 230 is powered up at all times during operation of system 200. Secondary power system 230 may be passive until a failure of one or more components of the primary power system for one or more of electrical loads 204, at which time secondary power system 230 may become active.

Various ones of power components in the power distribution chain, including UPSs 218, PDUs 220, switching assemblies 222, and rack PDUs 208 include communication modules 224. Each of communication modules 224 may send and receive signals to at least some portion of other power components in system 200, which may include communication modules 224 in other power components, one or more modules located in switching assembly 222, etc. Signals 227 between communication modules 224 may be sent over power transmission lines 226 between the power components.

In some embodiments, power components in a power distribution system exchange signals based on a protocol for exchanging, reporting, and using signals among power components. The protocol may define signal formats, message formats, rules, and procedures. In some embodiments, a power component that includes a communication module 224 includes a protocol for acquiring connectivity information among power components in the power distribution system. Each power component that sends or receives messages identifying information may send identity and system location messages in a prescribed format.

In some embodiments, messaging formats, rules, synchronization, or other aspects of signals between power components are implemented in accordance with, or based on, a standard protocol, such as link layer discovery protocol (LLDP) or industry standard discovery protocol (ISDP).

In some embodiments, power components send and receive signals over one or more power transmission lines while power is being transmitted over the power transmission line. In one embodiment, signals between power components are transmitted over alternating current (AC) power supplied by a power distribution system. In certain embodiments, signals are transmitted over direct current (DC) power supplied by a power distribution system.

In some embodiments, power components in a power distribution system are each assigned one or more identifiers. Each identifier may serve as an address for the power component or a constituent element of the power component. The identifier may be stored in a memory on the power component. The address may be used to map power components in the power distribution system. An identifier for power component may have any suitable format. In some embodiments, a separate identifier may be assigned for the power component itself and for additional elements, inputs, or outputs within the power component. For example, a separate identifier may be established for each power output receptacle of a power distribution unit.

In some embodiments, one or more communication modules 224 sends and receives messages 225 to external systems, which may include one or more computer systems external to system 200, over a network connection. Messages 225 sent to communication modules 224 over a network connection may include instructions to a given communication module 224 on what signals 227 are to be transmitted to upstream or downstream components over a power transmission line 226 by the communication module 224. Messages 225 sent to external computer systems (not shown in FIG. 2) over a network connection may include information acquired from signals received by the communication module 224, such as what UPS the power component is receiving power from, what phase of power the power component is receiving, various information associated with various other power components in data center 200, etc. In certain embodiments, information from signal exchanges between power components is used in conjunction with information acquired from branch circuit monitoring. For example, switching assembly may push data, which may include event logs, diagnostic information, performance data, indications of failures associated with one or more portions of switching assembly 222, etc. to a module 224 located in a UPS 218, where the module 224 may transmit 225 the data to an external computer system. The external computer system may analyze the data transmitted 225, and may take one or more corrective actions in response to the analysis. Such corrective action may include transmitting one or more messages to one or more modules 224 to be communicated to switching assembly 222 over one or more power transmission lines. Such messages may include one or more commands, including a command to communicate additional data; activate an alert indicator to indicate an alert to operators via one or more visual indicators including lights, audio tones, etc.; override switching mechanism firmware to perform a switching function, etc.

In some embodiments, signals exchanged among power components are used to monitor and assess characteristics of various portions of a power distribution system. Characteristics or conditions of some or all of the power distribution system, including current characteristics or conditions associated with various power components, may be used to measure ("determine") performance, power quality, power consumption, power draw, stability, service levels, or other attributes of a power distribution system. Examples of characteristics of a portion of a power distribution system that may be included in signals exchanged among power components include phase, power redundancy, voltage levels, current levels, usage levels, and temperature.

In some embodiments, signals exchanged among power components are used to communicate commands between power components and to determine a configuration of one or more power components in a power distribution system. For example, a power supply unit may, based at least in part upon a command from an external system, transmit a command to a downstream switching assembly to switch to a secondary power distribution system, which can, in some embodiments, include a reserve power distribution system. The power supply unit may also receive identification signals from the downstream switching assembly. From the identification signals, it may be determined whether the downstream switching assembly has actually successfully switched to the secondary power distribution system or whether the assembly has failed to switch to the secondary power distribution system.

In some embodiments, power components in secondary power system 230 exchange power-related signals among one another or with power components in a primary power distribution system. In certain embodiments, power components in a secondary power system include communication modules, including communication modules 224. Such communication modules may communicate with one or more external systems, one or more components in data center 200, some combination thereof, or the like. For example, secondary power system 230 may include one or more communication modules that may communicate with switching assembly 222, where the communication modules communicate information indicating characteristics or conditions of one or more portions of the secondary power system, including characteristics or conditions of one or more power components in the secondary power system 230.

Switching assembly 222 routes power to one or more electrical loads 204 in rack 206. In some embodiments, switching assembly 222 includes a switching mechanism, which may include an automatic transfer switch that selectively routes one or more power feeds received from one or more power distribution systems to a downstream electrical load. Each received power feed may be received over a power transmission line. For example, switching assembly 222 in the illustrated embodiment can selectively route a power feed received from primary power system 216 over power transmission line 226 or a power feed received from secondary power system 230 over another power transmission line. Switching assembly 222 includes a power monitoring module 223 which can, in some embodiments, determine whether to command the switching mechanism to switch between routing certain received power feeds to the electrical load 204. In some embodiments, power monitoring module 223 comprises multiple modules of a switching assembly, as illustrated below with reference to at least FIGS. 4-5. As discussed above, with reference to FIG. 1, power monitoring module 223 may monitor one or more characteristics of one or more power feeds received at the switching assembly 222 over power transmission line 226, including voltage, phase, etc. to determine whether to switch from the primary power feed from primary power system 216 to the secondary power feed from secondary power system 230.

In some embodiments, a switching assembly 222, in addition or in alternative to monitoring power feed characteristics of power feeds received at the switching assembly, monitors one or more characteristics or conditions of one or more portions of one or more power distribution systems based at least in part upon processing data signals received from one or more power components over one or more power transmission lines, where the processed data signals can include information indicating the characteristics or conditions. Data signals may be received from one or more power components in a data center, including one or more external systems. As shown in the illustrated embodiment, switching assembly 222 can receive data signals communicated by one or more power components in data center 200 via one or more communication modules 224. The data signals can include various information associated with one or more portions of a power distribution system, including currently-occurring characteristics and conditions in the one or more portions, characteristics or conditions occurring within a certain time period of the data signal generation, etc. For example, where a data signal is communicated from a communication module 224 of a UPS to switching assembly 222, the data signal may include information indicating a voltage of power received at the UPS, voltage of power supplied by the UPS, operating parameters of the UPS including temperature, power phase(s), current, etc. The data signals may be communicated to the switching assembly via a power transmission line.

In some embodiments, the switching assembly processes data signals received over the power transmission line to recover information included in the data signals indicating one or more characteristics and conditions and monitors the characteristics and conditions as part of a determination of whether to switch between routing certain power feeds to a downstream electrical load. For example, switching assembly 222 may receive data signals from the UPS, where the data signals include information indicating current power voltage supplied by the UPS, and switching assembly 222 may process the received signals to recover information indicating the current power voltage of the UPS. A portion of the switching assembly 222, including the power monitoring module 223, may determine, based on the current power voltage supplied by the UPS, whether to command a switching mechanism to switch from the primary power system to the secondary power system 230. Such a determination may be based at least in part upon a comparison of the characteristic monitored via the received data signals with a predetermined threshold. Such a threshold, if met by a current characteristic or condition of a portion of a power system, may indicate a fault condition in at least a portion of the power system, such that a proper response includes switching from that power system to another power system. For example, where a current power output voltage from a UPS is monitored by switching assembly 222 via data signals 227 received over the power transmission line 226, the power monitoring module 223 may respond to determining that the current power output voltage drops below a voltage drop threshold value by commanding a switching mechanism to switch from routing a primary power feed from primary power system 216 to a secondary power feed from secondary power system 230.

In some embodiments, information included in a data signal includes one or more tones, including one or more "heartbeat" signals, that indicate one or more characteristics or conditions of one or more portions of a power system. A communication module of one or more power components may transmit one or more heartbeat signals over a power transmission line, where a given heartbeat signal indicates that one or more characteristics or conditions are within a certain range of values. For example, a communication module may concurrently transmit two heartbeat signals over a power transmission line, where one heartbeat signal is always transmitted, indicating that the communication module is connected to the power transmission line, and another heartbeat signal is transmitted if voltage of power supplied by a certain power component is within a certain range of values, so that absence of the heartbeat signal indicates that voltage is outside of the certain range, which can be interpreted by one or more power components monitoring the power transmission line for the heartbeat signals as an indication of a presence of an anomaly, fault condition, etc. with regard to the power component, power distribution system, some combination thereof, or the like. The switching assembly can, in some embodiments, receive and process data signals from the communication module and determine, based upon absence or presence of one or more of the heartbeat signals in the power transmission line, whether to switch between power systems. For example, where the voltage heartbeat signal and power component heartbeat signals are both present, the switching assembly may determine that power is to be routed from the primary power system 216 to the electrical load 204. Where the power component heartbeat signal is present but the voltage heartbeat signal is absent, indicating that power voltage at a power component in the primary power system 216, including a UPS, is outside a certain range of values, the switching assembly 222 may determine that a fault condition is present in the primary power system 216 and command a switching mechanism to switch to the secondary power system 230. Where both heartbeat signals are absent, the switching assembly 222 may determine that communication module 224 is decoupled from the switching assembly 222 via a power transmission line and may adjust one or more other parameters used to determine whether to switch power feeds, including one or more sets of power feed characteristic threshold values against which measured power feed characteristics can be compared.

In some embodiments, switching assembly 222 uses monitored power feed characteristics of power feeds received at the switching assembly and characteristics or conditions of a portion of a power system monitored via data signals received over a power transmission line to determine whether to switch between power feeds. For example, switching assembly 222 may monitor a power feed characteristic that includes voltage of the power feed received over power transmission line 226 and may process data signals 227 received over the power transmission line 226 to monitor a characteristic or condition of a portion of primary power system 216 that includes voltage of power supplied from UPS 1 as part of determining whether to switch between primary power system 216 and secondary power system 230.

In some embodiments, power feed characteristics monitored via a received power feed and characteristics or conditions of power components monitored via received data signals over a power transmission line separately influence a determination of whether to switch between power systems. For example, while a switching determination may ultimately be made based at least in part upon whether a measured power feed characteristic at least meets one or more predetermined threshold values, the threshold values themselves may be dynamically determined based at least in part upon the characteristics or conditioned monitored via received and processed data signals. For example, a data signal may be received over a power transmission line and processed to recover information indicating one or more characteristics or conditions of a portion of a power distribution system, and the characteristics or conditions may be compared against one or more threshold values.

In some embodiments, where the characteristics or conditions at least meet one or more of the threshold values, one or more power feed characteristic threshold values can be adjusted to one or more particular values. For example, where a current condition of a power component is determined, based upon processed data signals, to at least meet a certain threshold, a power feed characteristic threshold for power feed voltage may be increased, so that a determination to switch between power feeds may be made if the power feed voltage at least meets or falls below the increased threshold value rather than the previous, lower threshold value. Where the current condition of the power component is subsequently determined, based upon processed data signals, to no longer at least meet a certain threshold, the power feed characteristic threshold for power feed voltage may be decreased, so that a determination to switch between power feeds may be made if the power feed voltage at least meets or falls below the decreased threshold value rather than the previous, higher threshold value.

In this manner, the sensitivity or "tolerance" range of the switching assembly to variations in power feed characteristics may be adjusted based at least in part upon monitored characteristics or conditions at one or more portions of the power distribution system. For example, if power supplied from a UPS is determined, via processed data signals, to be stable based upon current characteristics and conditions associated with the UPS being within one or more sets of threshold values, the "tolerance" threshold values for power feed characteristics measured at the switching assembly may be adjusted to increase the "tolerance" range to make the switching assembly less sensitive to anomalies in the power feed characteristics, as the monitored UPS characteristics may be interpreted to indicate that power feed anomalies, including noise and harmonics, are less likely to indicate a fault condition. In another example, where power supplied from a UPS is determined, via processed data signals, to be potentially unstable based upon current characteristics and conditions associated with the UPS at least meeting one or more sets of threshold values, the "tolerance" threshold values for power feed characteristics measured at the switching assembly may be adjusted to decrease the "tolerance" range to make the switching assembly more sensitive to anomalies in the power feed characteristics, as the monitored UPS characteristics may be interpreted to indicate that the power feed is more likely to have a fault condition. The "tolerance" threshold values for power feed characteristics measured at the switching assembly may subsequently be adjusted to increase the "tolerance" range to make the switching assembly less sensitive to anomalies in the power feed characteristics, based at least in part upon subsequently determining that power supplied from a UPS be stable based upon current characteristics and conditions associated with the UPS ceasing to at least meet the one or more sets of threshold values, In some embodiments, multiple sets of threshold values may be associated with one or more characteristics or conditions of various portions of a power distribution system, and a determination that monitored characteristics or conditions are meeting or exceeding a certain set of threshold values may result in one or more power feed characteristic thresholds being adjusted to separate particular values. For example, each characteristic or condition may have several progressive sets of threshold values that correspond to separate progressive power feed characteristic threshold values, so that a change in a current characteristic or condition that results in that characteristic or condition meeting a certain set of threshold values may correspond to a certain amount of adjustment of a power feed characteristic threshold value based at least in part upon which sets of characteristic or condition threshold values are met or exceeded. Such adjustment may be implemented at the switching assembly based at least in part upon determining that a characteristic or condition, monitored via processing of received data signals, at least meets or exceeds one or more sets of threshold values.

In some embodiments, switching assembly 222 and one or more power components may communicate various information between each other and one or more external systems via one or more power transmission lines used to supply power from the power components to the switching assembly. In FIG. 2, arrows are used to illustrate one example of signals being passed upstream and downstream among power components in power distribution system 202.

For example, signals 227 may be passed between UPS 1 and switching assembly 222. In some embodiments, signals transmitted by a power component may be associated with a particular component in a power distribution system, a combination of components (a primary power system with a particular UPS and a particular set of PDUs), or a point or location in the power distribution system. In some embodiments, signals exchanged by power components are used to monitor one or more characteristics or conditions of one or more power components, push data to one or more power components, etc. For example, various power components, including one or more parts of switching assembly 222, may generate event logs, etc., which may be communicated to one or more power components, which may analyze and utilize the event logs to issue commands to one or more power components. Such issued commands may include corrective actions taken based at least in part upon analysis of the received event log data. In another example, various power components may push instructions to other power components via the power transmission lines, including commanding a switching mechanism to switch power systems, pushing firmware updates to various power components including switching assemblies, etc.

Figure 3:
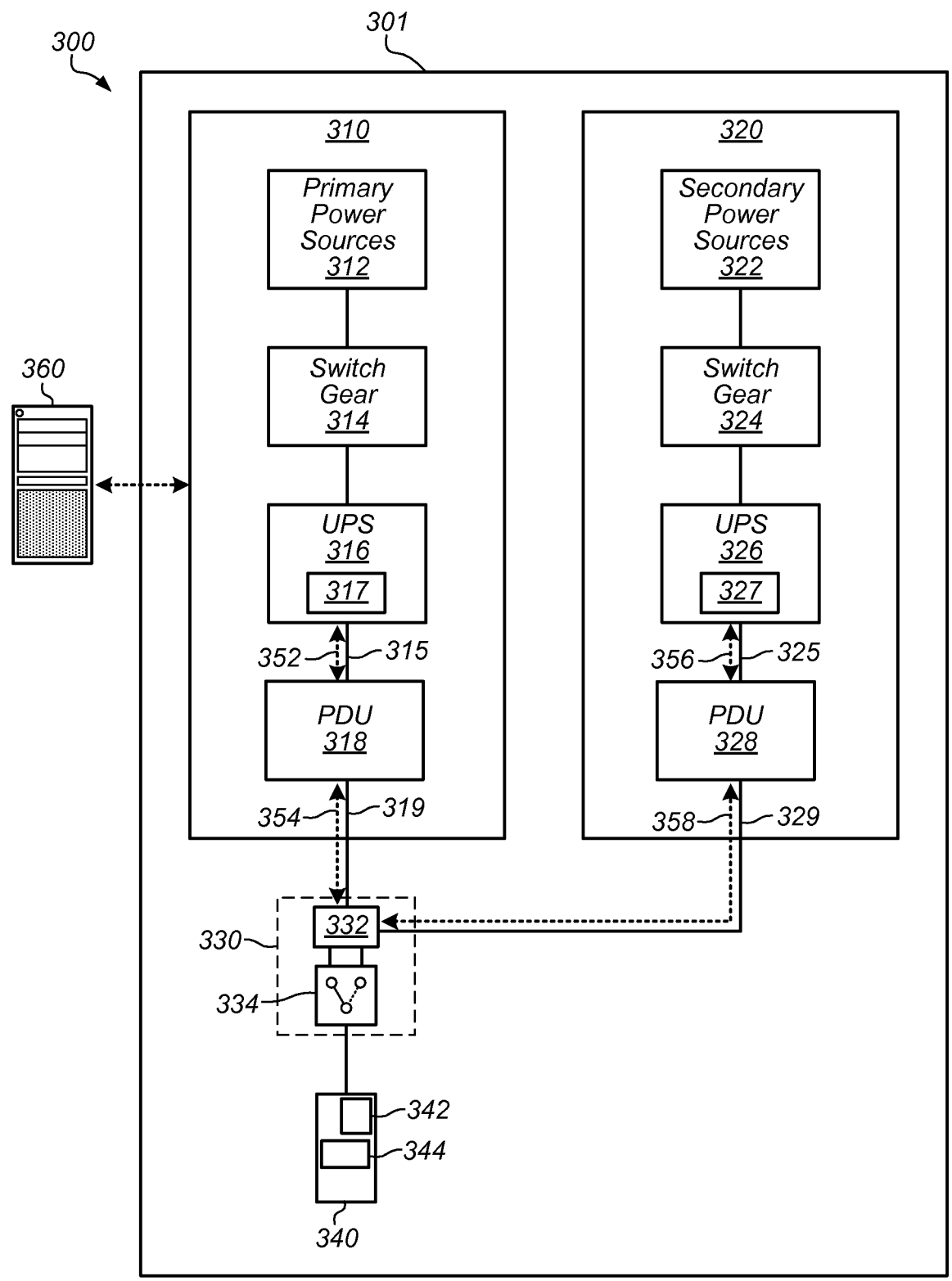
FIG. 3 illustrates a system that allows information exchange over power transmission lines between components of a power distribution system and switching assemblies that selectively supply power to computing devices from separate power distribution systems, according to some embodiments.

FIG. 3 illustrates a system that allows information exchange over power transmission lines between components of a power distribution system and switching assemblies that selectively supply power to computing devices from separate power distribution systems, according to some embodiments.

System 300 includes a data center 301 that includes a primary power distribution system 310, secondary power distribution system 320, switching assembly 330, server rack 340, and an external computer system 360. The server rack 340 includes a rack PDU 342 and one or more computer systems 344. The power distribution systems and switching assembly can communicate via one or more power transmission lines used to provide power support by the respective power systems to electrical loads included in the rack 340 via the switching assembly 330.

The switching assembly 330 includes a switching mechanism 334 and a power monitoring module 332. The switching mechanism 334 can include an automatic transfer switch that can switch between routing a primary power feed from primary power system 310 or routing a secondary power feed from secondary power system 320 to the rack 340. The power monitoring module 332, which, as illustrated further in at least FIG. 4-5 can include one or more various modules, can monitor one or more characteristics or conditions of one or more portions of the data center and can manage the switching mechanism, including commanding the switching mechanism to switch between power feeds, based at least in part upon the monitored characteristics or conditions. In some embodiments, a power monitoring module can route power from one or more power distribution systems to one or more switching mechanisms.

In some embodiments, as discussed further below, one or more portions of the power monitoring module 332 can be included in a separate device from the switching mechanism, including an interposer device that interposes the power transmission line and the switching mechanism, so that the interposer device routes one or more power feeds from one or more power transmission lines to the switching mechanism and one or more modules included in the interposer device monitor the power feeds and manage the switching device based at least in part upon the monitoring, including monitoring one or more power feed characteristics of the routed power feeds, receiving and processing data signals received over the power transmission lines to monitor one or more characteristics or conditions based on information recovered from processing the data signals, and sending certain commands to the switching mechanism based upon monitoring the various characteristics. The interposer device may command the switching mechanism over a separate communication pathway from the power transmission line that the interposer device interposes, including a network cable connection to a network interface of the switching mechanism.

In some embodiments, power monitoring module 332 uses data signals received over one or more power transmission lines from one or more power components in one or more power systems of data center 301 to at least partially influence a determination of whether to command switching mechanism 334 to switch between routing certain power feeds. As shown in the illustrated embodiment, signals may be communicated 352, 354 between UPS 316 of primary power system 310 and switching assembly 330 via power transmission lines 315, 319. The signals communicated from the UPS 316 to the switching assembly 330 may include information indicating one or more current characteristics or conditions associated with the primary power system 310, including one or more current characteristics or conditions associated with the UPS 316. For example, the information may indicate a voltage of power supplied by the UPS 316 to PDU 318 over line 315, a voltage of power received at the UPS 316 from one or more power sources 312 via switchgear 314, etc. One or more portions of switching assembly 330, including power monitoring module 332, may process the data signals to monitor the characteristics or conditions and may determine whether to switch between power systems based at least in part on the monitoring.

In some embodiments, signals communicated from the UPS 316 to the switching assembly 330 via power lines 315, 317 are generated by one or more communication modules 317 included in the UPS 316. For example, the communication module 317 may monitor one or more characteristics or conditions associated with the UPS 316 and may generate data signals to be transmitted over the power transmission lines based at least in part upon the monitoring. For example, the communication module may inject one or more particular heartbeat signals into the power transmission line based at least in part upon comparing one or more power characteristics or conditions of primary power system 310 against one or more sets of threshold values.

As noted above, switching assembly 330, in some embodiments, receives and processes data signals received from various power components in various power systems. Receipt and processing of data signals communicated over a power transmission line, as referred to herein, should be understood to encompass various systems and methods for communication over a power transmission line known in the art. As shown in the illustrated embodiment, switching assembly 330 may, in addition to receiving data signals from a power component in primary power system 310, may receive data signals from a power component in secondary power system 320, including a UPS 326 that includes its own communication module 327. Switching assembly 330 may receive data signals from one or more other components in secondary power system 320, including one or more secondary power sources 322, switch gear 324, PDU 328, some combination thereof, or the like. The communication module 327 may generate data signals including information that indicates one or more characteristics or conditions of one or more portions of the secondary power system 320, and the data signals 356, 356 may be communicated to the switching assembly 330 over one or more power transmission lines 325, 329 used to provide secondary power support from the secondary power system 320 to the rack 340. In some embodiments, a portion of switching assembly 330 processes data signals 356 received over power transmission line 329 to determine whether to switch to secondary power system 320. In some embodiments, a switching assembly 330 includes separate power monitoring modules that each process data signals received from separate power distribution systems. In some embodiments, the switching assembly 330 includes one or more power monitoring modules that process data signals received from multiple power distribution system. A power monitoring module may route power from multiple power distribution systems to one or more switching mechanisms, including one or more switching mechanisms 334. Power monitoring module 332 may process the data signals 356 and may monitor one or more characteristics or conditions of secondary power system 320 to determine whether to preclude switching from primary power system 310 to secondary power system 320. For example, where secondary power system 320 is determined to be supplying unstable power, power monitoring module 332 may partially or totally preclude switching from primary power system 310 to secondary power system 320, as the module may determine that continuing to route a primary power feed from primary power system 310 is preferable to relying upon a secondary power feed from secondary power system 320. Partial preclusion from switching may include adjusting one or more power feed characteristic thresholds for monitoring the primary power feed to increase the "tolerance" of the switching assembly 330 to anomalies in the primary power feed, so that the switching assembly 330 is less sensitive to primary power feed anomalies. In addition, the switching assembly may determine that the secondary power system 320 is already supplying power to one or more electrical loads, such that the secondary power system is supplying more than a certain threshold fraction of its total power supply capacity, and may respond by partially or totally precluding switching to the secondary power system 320 to mitigate the possibility of an overload condition in the secondary power system from multiple loads being switched to the secondary power system unnecessarily.

In some embodiments, communication between various power components may be used to manage selective energization of various power components in various power distribution systems based at least in part upon a switching between power distribution systems. For example, communication module 317 may transmit a command to switching assembly 330, via power transmission lines 315, 319, to switch to secondary power system 320. Such a command may be transmitted based upon a command received from an external computer system 360 via one or more various communication pathways, including over a power transmission line, network cable connection, wireless network connection, some combination thereof, or the like. In some embodiments, the command may be transmitted to switch the rack 340 away from primary power system 310 so that one or more power components in the primary power system 310 can be de-energized for various needs, including maintenance, inspection, etc., without compromising power support for the racks.

In some embodiments, the communication module 317 monitors communications from switching assembly 330 to verify whether the switching mechanism 334 has actually switched away from primary power system 310. If the communication module 317 determines that the switching mechanism 334 has failed to switch away from primary power system 310, based upon received data signals from switching assembly via power transmission lines 315, 319, absence of data signals, etc., the communication module can, in response, preclude one or more power components of primary power system 310 from being powered down. Such preclusion may include the communication module transmitting a lock-out signal to one or more power components in primary power system 310, external computer system 360, etc. Such a lock out signal may include a command inhibiting the power components from powering down, an instruction to manually inspect and switch the switching mechanisms 334, etc. Therefore, the communication between one or more power components and the switching assembly can ensure uninterrupted power supply to the racks by precluding powering down a power system until the supported loads are verified to be switched to another power system.

In some embodiments, communication between power components and the switching assembly over power transmission lines can enable management of various aspects of the various power components and switching assemblies. For example, switching assembly 330 can communicate performance information, event logs, diagnostic information, system configuration information, etc. to communication module 317 over power transmission lines 315, 319, and communication module 317 may store such information in a database, forward the information to external computer system 360 for analysis, take corrective action, etc. Such corrective action by external computer system 360 may include transmitting a message to one or more portions of switching assembly 330 via communication with module 317 over a network connection and communication of the message from module 317 to switching assembly 330 via power transmission lines 315, 319. Such a transmitted message may include one or more commands generated at the external computer system 360 based at least in part upon analysis of the information forwarded to the external computer system 360 from switching assembly 330 via power transmission lines 315, 319 and a network connection with module 317. The corrective action may include a command to one or more portions of switching assembly 330 to perform one or more various functions, including commanding switching mechanism 334 to switch power feeds, overriding at least a portion of firmware associated with some portion of switching assembly 330, communicate additional data to one or more power components, activate an alert indicator to indicate an alert to operators via one or more visual indicators, some combination thereof, etc. The message may further include a command to one or more power components in one or more of the power systems 310, 320, including one or more commands to lock out power-down functionality of various power components in the power systems. In another example, updates to various portions of one or more power components or switching assemblies, including an update to firmware of a portion of switching assembly 330, may be communicated over one or more power transmission lines. External computer system 360 may provide update data to communication module 317 over a network connection, and module 317 may then push the update data to one or more devices over the power transmission lines in the data center 301. As a result, a need for communicating between various devices in a data center via additional communication pathways other than power transmission lines already used to supply power to the server racks may be partially or totally precluded.

Figure 4:
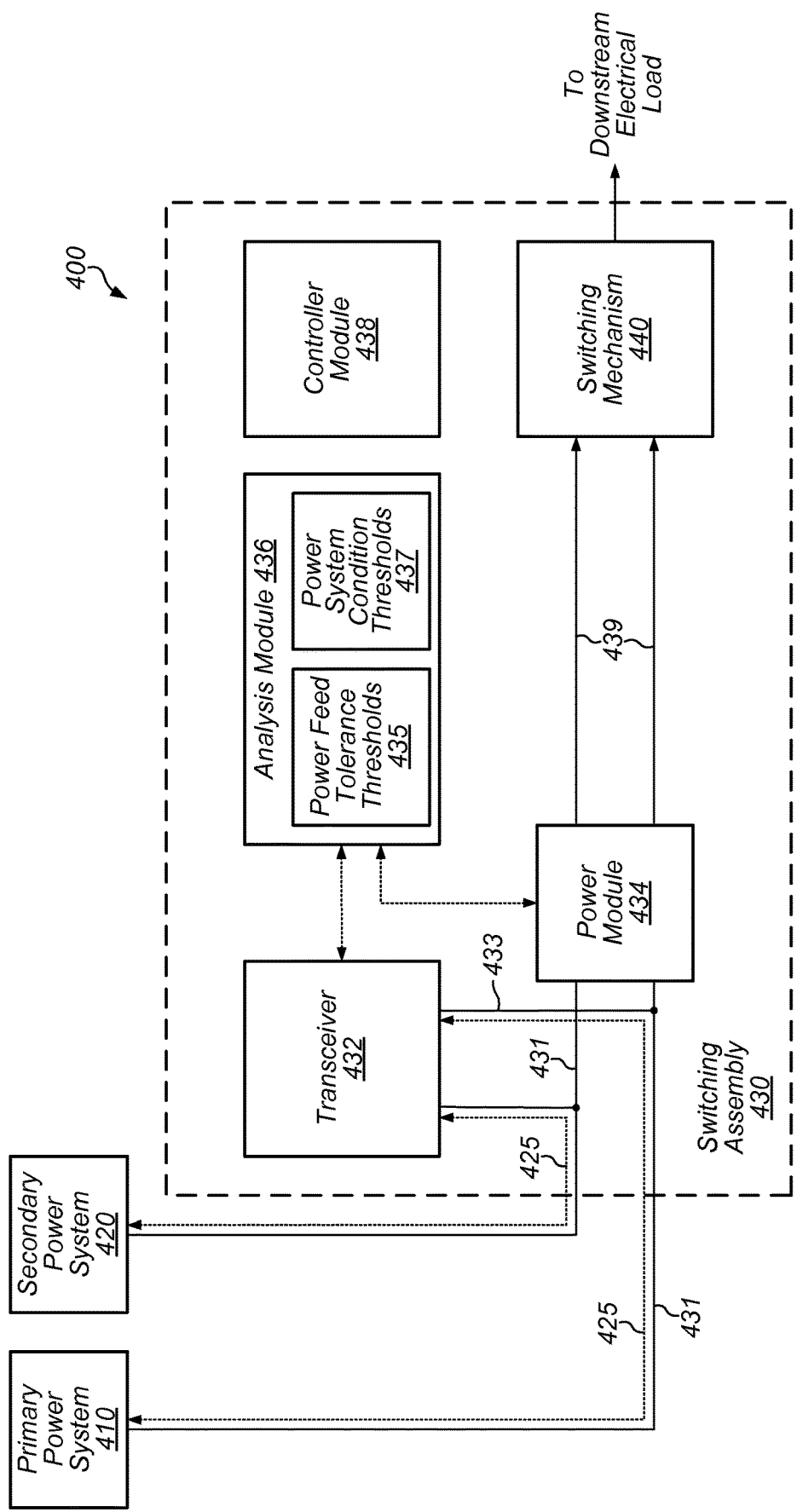
FIG. 4 illustrates a switching assembly that selectively routes power from one of two upstream power distribution systems to a downstream electrical load, according to some embodiments.

FIG. 4 illustrates a switching assembly that selectively routes power from one of two upstream power distribution systems to a downstream electrical load, according to some embodiments. System 400 includes primary power system 410, secondary power system 420, and switching assembly 430 that selectively routes power from one of the power systems to a downstream coupled electrical load, which may include a server in a server rack. In some embodiments, one or more portions of a switching assembly, including one or more modules described herein, is implemented at least partially by one or more computer systems, which are described further below.

Switching assembly 430 receives power from the power systems over respective power transmission lines 431. The power transmission lines are routed 439 through a power module 434 to a switching mechanism 440 that switches between one of the power transmission lines to route power from one of the power transmission lines to the downstream coupled electrical load.

Power module 434 may include one or more sensor systems and components that monitor one or more characteristics or conditions of the power feeds received over power transmission lines 431. Sensor systems and components may include a sensor that measures voltage on a power transmission line, power phase, power current, etc. The sensor systems and components may generate sensor data based on the measurements and communicate the data to analysis module 436.

Transceiver 432 is coupled to power transmission lines 431 by way of lines 433. In some embodiments, a separate line connects each of the power transmission lines to the transceiver. In some embodiments, multiple transceivers are each coupled to separate power transmission lines. Transceiver 432 may send and receive signals 425 over power transmission lines 431, including one or more data signals. For example, transceiver 432 may send and receive signals from a UPS or other upstream power component of one or more power systems supplying power switching assembly 430 by way of power transmission lines 431.

Transceiver 432 may receive data signals from one or more power components in one or more power system 410, 420, where one or more of the data signals include information indicating one or more characteristics or conditions of one or more portions of the power systems. The transceiver 432 may include systems and components that can identify and receive the data signals 425 over the power transmission lines 431. The transceiver 432 may communicate the received data signals 425 to analysis module 436.

Analysis module 436, in some embodiments, analyzes data received from one or more of power module 434 and transceiver 432 and makes one or more various determinations regarding some or all of one or more of power systems 410 and 420.

In some embodiments, analysis module 436 processes data signals received at transceiver 432 from one or more power systems over power transmission lines 431 to recover information indicating one or more characteristics or conditions associated with one or more portions of one or more power systems. The analysis module may analyze the information to monitor the characteristics or conditions. Such monitoring may occur continuously, in response to each received data signal, cumulatively based at least in part on historical data, etc. For example, analysis module 436 may compare each characteristic or condition indicated by information recovered from a single data signal against one or more sets of threshold values 437. Based on such comparison, the analysis module 436 may determine whether a fault condition is present in the power system. For example, if the characteristic or condition indicated in a data signal at least meets a stored threshold value 437, a fault condition may be determined to be present in the power system from which the data signal was received.

In some embodiments, a fault condition may not be immediately determined based at least in part upon determination of an anomaly with regard to one or more characteristics or conditions, and a determination that one or more characteristics or conditions meet one or more sets of threshold values, which may be interpreted as an indication of an anomaly, may influence analysis of one or more other characteristics or conditions to determine whether a fault condition is present. For example, analysis module 436 may compare power feed characteristics of one or more power transmission lines 431, received from power module 434, against one or more sets of power feed characteristic threshold values 435 to determine whether to switch between power systems based at least in part upon whether one or more power feed characteristics at least meet one or more sets of power feed threshold values. In some embodiments, analysis module 436 may adjust one or more sets of power feed threshold values 435 against which the power feed characteristics are compared based at least in part upon a comparison of the power system characteristics or conditions against the threshold values 437.

In some embodiments, analysis module 436 makes one or more determinations based upon analysis of one or more characteristics or conditions and communicates such determinations to the controller module 438. Such passed determinations may include a determination of a fault condition, a determination that one or more characteristics at least meet one or more threshold values, etc. The controller module 438 manages one or more operations of the switching mechanism 440 based at least in part upon determinations received from the analysis module 436. In some embodiments, controller module generates one or more commands to the switching mechanism 440 to switch from routing one particular power feed to routing another particular power feed.

In some embodiments, the controller module 438 generates one or more commands to the switching mechanism 440 to initiate one or more switching operations. In some embodiments, controller module 440 responds to one or more determinations received from the analysis module 436 by precluding from generating one or more commands, commanding one or more switching mechanisms 440 to continue current operations, some combination thereof, or the like.

In some embodiments, one or more modules in switching assembly 430 can communicate information to one or more power components of a power system over a power transmission line 431. For example, where switching mechanism 440 performs a switching operation to switch between power systems, transceiver 432 may transmit a data signal 425 to a power component of the primary power system 410 over power transmission line 431, where the transmitted data signal indicates to the power component that the switching mechanism 440 has performed the switching operation. In some embodiments, the transmission of the data signal is based at least in part upon receipt of a data signal from a power system. For example, switching assembly 430 may receive a data signal from primary power system 410 over power transmission line 431, where the received data signal includes a command to switch power systems. One or more of transceiver 432 and analysis module 436 may process the data signal and recover the command included in the data signal, and controller module 438 may command switching mechanism 440 to switch based at least in part upon the recovered command. One or more modules of switching assembly 430 may send a data signal back to primary power system 410 over power transmission line 431 based at least in part upon the switching mechanism 440 successfully completing the switching operation, where the sent data signal includes information indicating successful completion of the switching operation. Where the switching operation is not successfully completed, one or more modules of switching assembly 430 may, in some embodiments, abstain from transmitting a signal back to primary power system. In some embodiments, where the switching operation is not successfully completed, one or more modules of switching assembly 430 may send a data signal to primary power system 410 over power transmission line 425, where the data signal includes information indicating that the switching operation was not successfully completed.

Communications between switching assembly 430 and one or more components in power systems 410, 420 may include communications of one or more aspects of switching assembly 430, including device configurations, event logs, occurrence of one or more events local to the switching assembly 430, switching mechanism 440 state, etc. Messages including the communications may be generated using one or more various modules of assembly 430 and may be transmitted using transceiver 432. For example, messages including data regarding various event logs, performance information, occurrences, etc. regarding switching assembly 430 may be generated at least in part at analysis module 436, and transceiver 432 may transmit the messages over power transmission line 431 to one or more upstream components in one or more power system 410, 420. In some embodiments, the messages may be transmitted by the one or more components in systems 410, 420 to one or more external computer systems via one or more network connections for analysis, taking of corrective action, etc.

In some embodiments, one or more of the modules illustrated in FIG. 4 may be combined, split into additional modules, some combination thereof, or the like. For example, one or more aspects of analysis module 436 may be included in controller module 438, and controller module 438 may make one or more determinations regarding one or more power systems based at least in part upon received data signals, measured power feed characteristics, etc. In another example, one or more aspects of transceiver 432 and power module 434 may be combined in a common module.

Figure 5:
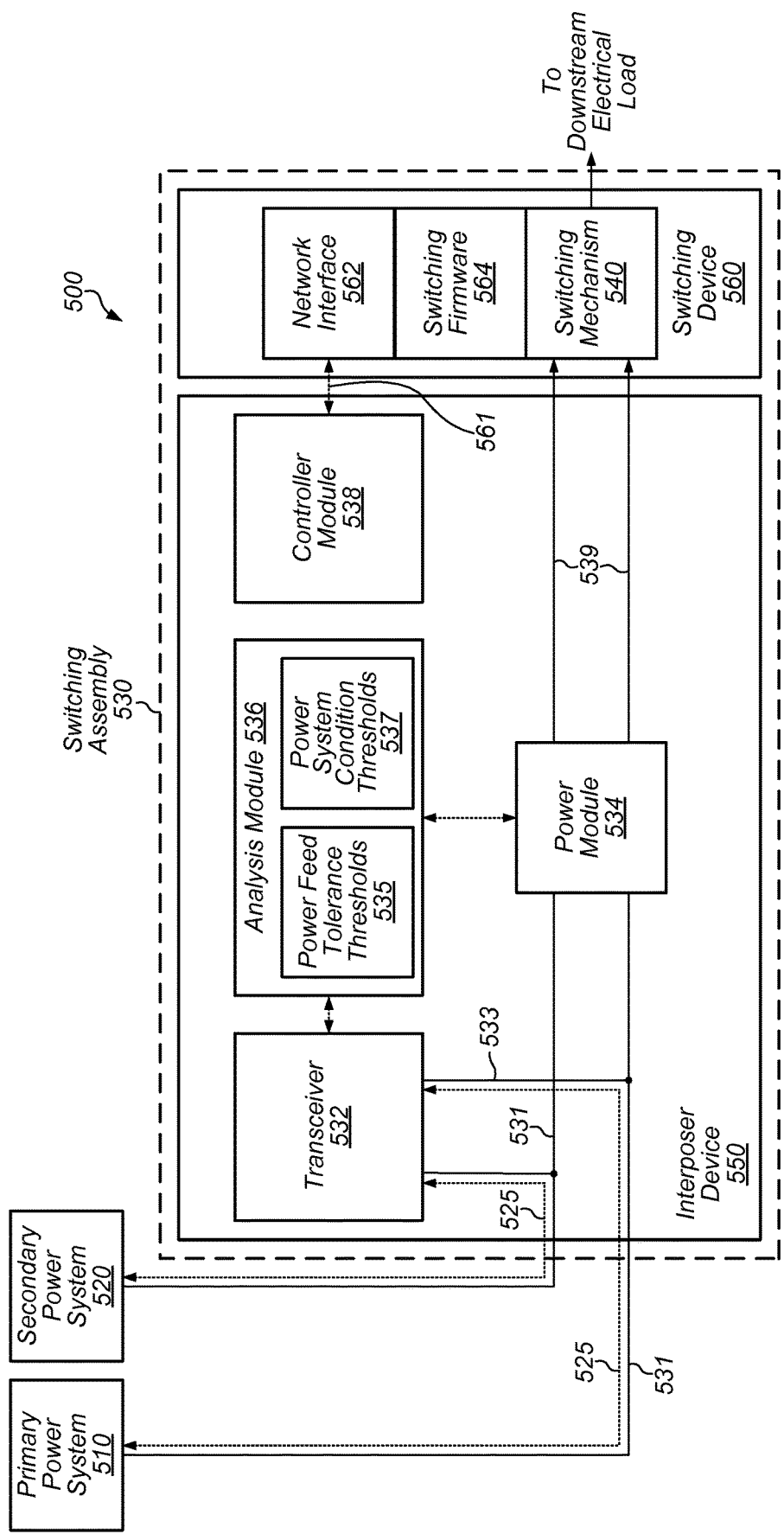
FIG. 5 illustrates a switching assembly, including an interposer switching controller device and a switching mechanism device, that selectively routes power from one of two upstream power distribution systems to a downstream electrical load, according to some embodiments.

FIG. 5 illustrates a switching assembly, including an interposer switching controller device and a switching mechanism device, that selectively routes power from one of two upstream power distribution systems to a downstream electrical load, according to some embodiments. Data center 500 includes primary power system 510, secondary power system 520, a switching assembly 530, and a downstream coupled electrical load. The switching assembly includes a switching mechanism device 560 and a separate interposer switching controller device 550. In some embodiments, one or more portions of each of a switching mechanism and an interposer device, including one or more modules described herein, is implemented at least partially by one or more computer systems, which are described further below.

In some embodiments, one or more modules and switching mechanisms of a switching assembly are included within a common device. For example, as discussed above with reference to the switching assembly of FIG. 4, a switching assembly may include a common devices that itself includes a transfer switch, including an ATS, and modules that can receive and process data signals received over a power transmission line and command a switching mechanism based at least in part upon monitoring information included in the data signals. Such a transfer switch may include hardware, firmware, etc. configured to implement various data signal receipt/transmission, processing, analysis, control aspects, etc.

In some embodiments, a switching assembly includes a switching mechanism that lacks one or more aspects of data signal receipt/transmission, processing, analysis, control aspects, etc. For example, in the illustrated embodiment, switching assembly 530 includes a switching mechanism 560 that lacks a transceiver module, analysis module, controller module, power module, and switching mechanism 560 may lack an internal ability to receive/transmit and process at least data signals 525 sent over power transmission lines 531 from one or more power systems 510, 520. In some embodiments, switching mechanism 560 includes one or more modules that can receive/process data signals from one power system and lacks one or more modules that can receive/process data signals from another separate power system.

In some embodiments, switching assembly 530 includes a separate interposer switching controller device 550 that communicates with one or more power components in one or more power systems 510, 520, receives and processes data signals 525 received over one or more power transmission lines 531, and generates commands to one or more portions of switching mechanism 560 based at least in part upon data signals 525 received over the one or more power transmission lines 531. The interposer switching controller device 550 may interpose a power distribution chain between one or more power systems 510, 520 and the switching mechanism 560, so that power selectively routed by the switching mechanism 550 from one or more of the power systems to a downstream electrical load is routed from a power transmission line 431, through interposer switching controller device 550, and to the switching mechanisms 550.

In some embodiments, an interposer switching controller device includes one or more modules that monitor one or more characteristics or conditions of one or more portions of a power system, power feed characteristics of one or more power feeds routed through the interposer device, etc. The interposer device can, in some embodiments, determine whether a switching mechanism separate from the interposer device is to switch which power feed is routed to a downstream electrical load based at least in part upon the above monitoring. For example, in the illustrated embodiment, interposer switching controller device 550 includes transceiver 532, power module 534, analysis module 536, and controller module 538 that can be used to monitor power feed characteristics of one or more power feeds routed through interposer switching controller device 550 from a power system to switching device 560 via power transmission lines 531, 539, monitor one or more characteristics or conditions of one or more portions of power systems 510, 520 based at least in part upon receiving and processing data signals 525 received at interposer switching controller device 550 over power transmission lines 531, and determine, based at least in part upon the monitoring, whether switching mechanism 540 in switching device 560 is to switch between power feeds. One or more portions of interposer device may determine, based at least in part upon receiving and processing data signals 525 from power system 510 over line 531, that a fault condition is present in at least a portion of power system 510 and that switching mechanism 540 should switch from routing power from power system 510 to routing power from power system 520. Therefore, one or more portions of an interposer device can monitor one or more aspects of system 500 on behalf of switching mechanism 540 in switching assembly 530 and determine whether switching mechanism 540 should switch power feeds, where switching device 560 itself may not be able to perform such monitoring and determination.

In some embodiments, an interposer manages some or all of a switching device based at least in part upon monitoring and determinations performed by the interposer device, including commanding a switching mechanism within the switching device. Such management can include overriding one or more aspects of the switching device's firmware, internal configurations, etc. Such management may include communicating with the switching device via a communication pathway that is separate from the power transmission line over which data signals are communicated between power components and the interposer device.

For example, in the illustrated embodiment, interposer switching controller device 550 includes a controller module 538 that, based at least in part upon one or more of monitoring and determinations made by one or more modules in interposer switching controller device 550, generates one or more commands to some or all of switching device 560 to switch between power feeds routed by switching mechanism 540. As shown, controller module 538 may be communicatively coupled to switching device 560 via a network cable connection to a network interface 562 of switching device 560. Network interface 562 may include an Ethernet network cable connection, and interposer switching controller device 550 may include a network cable connection, where controller module 538 can be communicatively coupled to network interface 562 via an Ethernet network cable. In such embodiments, controller module 538 can communicate with switching device 560 via a network cable connection with network interface 562. Communications between interposer switching controller device 550 and switching device 560 can include transmission of commands from interposer switching controller device 550 to switching device 560 via network interface 562, where the commands include commands to control switching mechanism.

In some embodiments, such commands may override some or all of the firmware 564 of the switching device 560 itself. For example, interposer switching controller device 550 may transmit a command to a portion of switching device 560, via network interface 562, to control switching mechanism 540 to switch between power systems. Communications between switching device 560 and interposer switching controller device 550 may include communications of device configurations, event logs, switching mechanism state, etc. from switching device 560 to interposer switching controller device 550, which may be communicated from interposer switching controller device 550 to one or more power components in one or more of systems 510, 520 via power transmission lines 531. Interposer switching controller device 550 may also communicate, via power transmission lines 531, indications of commands transmitted to switching device 560, so that one or more power components is informed of commands communicated to the switching device 560.

Figure 6:
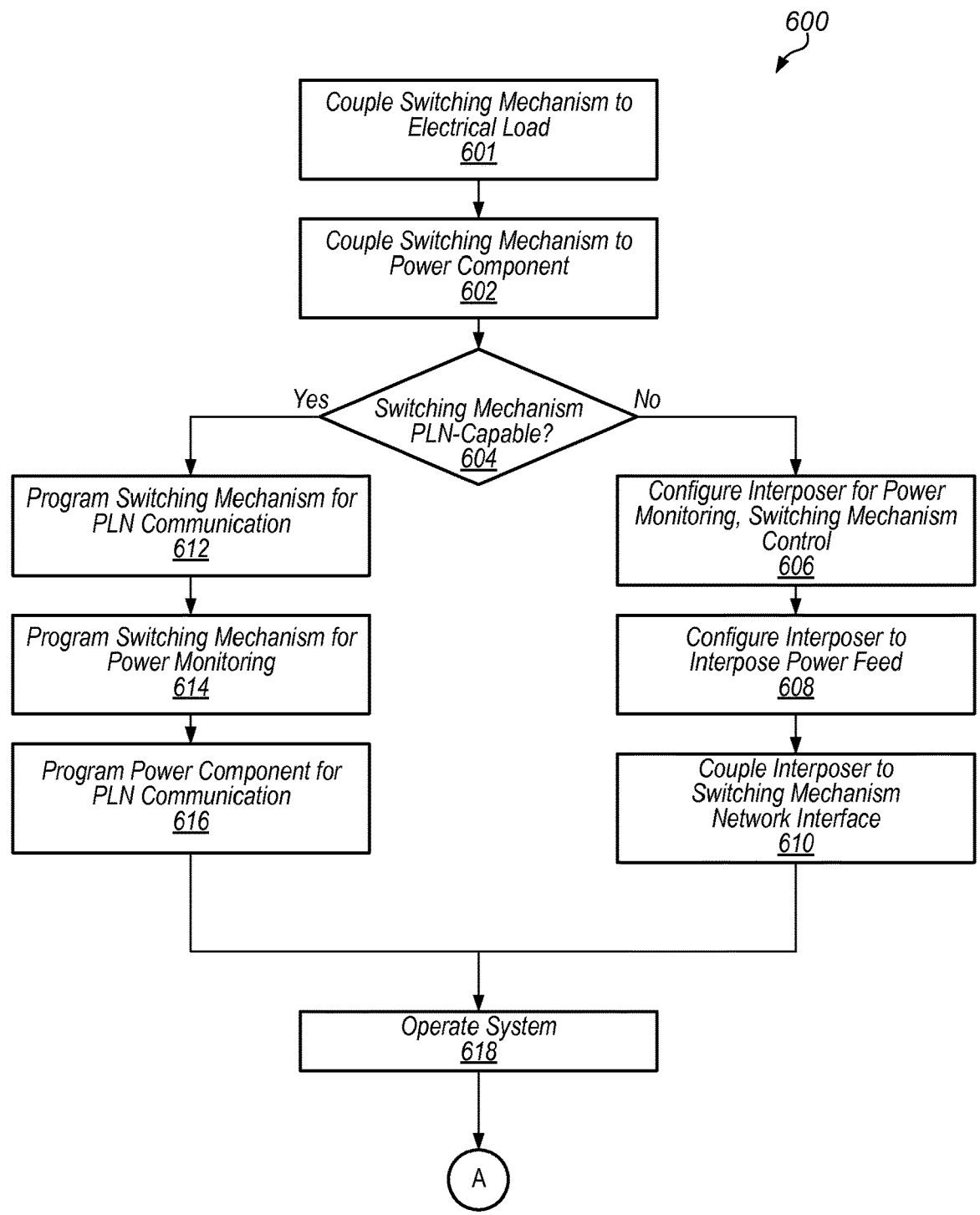
FIG. 6 illustrates configuring various systems and components of a power distribution system according to some embodiments.

FIG. 6 illustrates configuring various systems and components of a power distribution system 600 according to some embodiments. In some embodiments, such configuring 600, as shown at 601, may include coupling one or more portions of a switching mechanism, which may itself include one or more automatic transfer switches ("ATS"), to one or more electrical loads. The electrical loads may be coupled to a downstream side of the switching mechanism via a power output connector of the switching mechanism, so that the switching mechanism can supply power to the one or more electrical loads via the power output connector.

In some embodiments, such configuring 600, as shown at 602, may include coupling one or more portions of a switching mechanism to one or more power components of one or more power distribution systems that are on an upstream side of the switching mechanism. Such coupling may include coupling a power input connector of the switching mechanism to a connector of one or more power transmission lines that each can supply power from one or more separate sets of power systems, so that the one or more separate sets of power systems can supply power to the switching mechanism via the power transmission line and the power input connector and the switching mechanism can selectively route power received over the power transmission line at the power input connector to one or more electrical loads coupled, on a downstream side of the switching mechanism, to a power output connector of the switching mechanism.

As shown at 604 and 612, where the switching mechanism is included in a device that can communicate with other devices via data signals communicated over one or more power transmission lines (i.e., the device is "PLN-capable"), the device can be programmed to communicate with one or more particular power components over one or more power transmission lines. For example, one or more portions of the device, including device firmware, can be programmed overwritten, etc. to program the device to receive and process data signals from one or more power components, generate data signals to transmit to the one or more power components, external devices, etc. Such programming may include programming the device to with one or more protocols for exchanging, reporting, and using signals among power components. The protocols may define signal formats, message formats, rules, and procedures. The programming may include programming the device to recognize and identify one or more other power components from which a data signal originates or is to be transmitted based at least in part upon one or more address identifiers associated with the one or more other power components.

As shown at 614, a device including the switching mechanism can be programmed to monitor one or more characteristics or conditions of one or more portions of the coupled power distribution system, including one or more characteristics or conditions associated with one or more power components of the system, based at least in part upon data signals communicated over a power transmission line coupling the switching mechanism to the power distribution system. As discussed with reference to block 612, such programming may include programming, overwriting, etc. one or more portions of a device firmware. Such programming may include programming the device to identify and process one or more data signals, recover some or all information included in the data signal, compare the information with one or more sets of threshold values, manage and store one or more sets of threshold values, adjust one or more sets of threshold values based upon monitoring one or more sets of information included in one or more received and processed data signals, determine presence of one or more fault conditions, determine whether to command a switching mechanism to switch power feeds, some combination thereof, etc. Such programming may also include providing the device with one or more databases of one or more sets of threshold values associated with one or more characteristics or conditions associated with a power distribution system, power feed received from a power distribution system, etc.

At 616, one or more power components in a power distribution system coupled to the switching mechanism device via a power transmission line is programmed to communicate one or more data signals to the switching mechanism over the power transmission line. Such programming may include programming one or more communication modules associated with the power component. The communication modules may be programmed to generate data signals that include one or more sets of information indicating one or more characteristics or conditions of the power distribution system, including one or more characteristics or conditions associated with the power component in which the communication module is included. The communication module can be programmed to monitor one or more of the characteristics or conditions and generate a data signal based at least in part upon the monitoring. For example, the communication modules may be programmed to monitor power feed voltage at the power component and to generate a data signal that includes a "heartbeat" signal if the voltage at least meets one or more particular sets of threshold values and does not include the heartbeat signal if the voltage fails to meet at least one or more particular sets of threshold values, which can include a separate set of threshold values.

At 604 and 606, where the device including the switching mechanism lacks at least some of a capability to communicate, process, etc. data with one or more power components over the power transmission line, an interposer device is configured to monitor the power transmission line for data signals from the power distribution system, monitor the signals to determine whether the switching mechanism is to switch power feeds, command the switching mechanism to switch power feeds based at least in part on the monitoring, some combination thereof, etc. The interposer may be programmed similarly to a PLN-capable switching mechanism device, as discussed further above with reference to blocks 612-616. At 608, the interposer device is configured to interpose the power feed from the power distribution system to the switching mechanism device, where the power feed is routed from the power transmission line, through the interposer device, and to a power input connector of the switching mechanism device. The interposer device may monitor the power feed routed from the power transmission line for data signals from the power distribution system.

At 610, the interposer is communicatively coupled to the switching mechanism device via a network interface of the switching mechanism device. The interposer device may communicate data with the switching mechanism device through the network interface, rather than over a power transmission line, as the switching mechanism device may be at least partially incapable of such communication over a power transmission line. The interposer may communicate commands generated based at least in part upon monitoring data signals received over the power transmission line to the switching mechanism device via the network interface, where the commands include commands to control the switching mechanism. In some embodiments, the interposer device is programmed to generate commands to control one or more portions of the switching mechanism device. Such commands to control one or more portions of the switching mechanism device can include commands that are executable by one or more portions of the switching mechanism device, including a switching mechanism, device firmware, etc.

In some embodiments, an interposer device and coupled switching mechanism device are collectively referred to as a switching assembly. In some embodiments, including where a switching mechanism device is determined to be PLN-capable, the switching mechanism device is referred to as the switching assembly.

At 618, the configured system is operated. Power can be supplied from the coupled power distribution system to the switching assembly, which may selectively route power from the power distribution system or another power distribution system to a downstream electrical load based at least in part upon monitoring of data signals received at the switching assembly from one or more of the power distribution systems over one or more power transmission lines.

Figure 7:
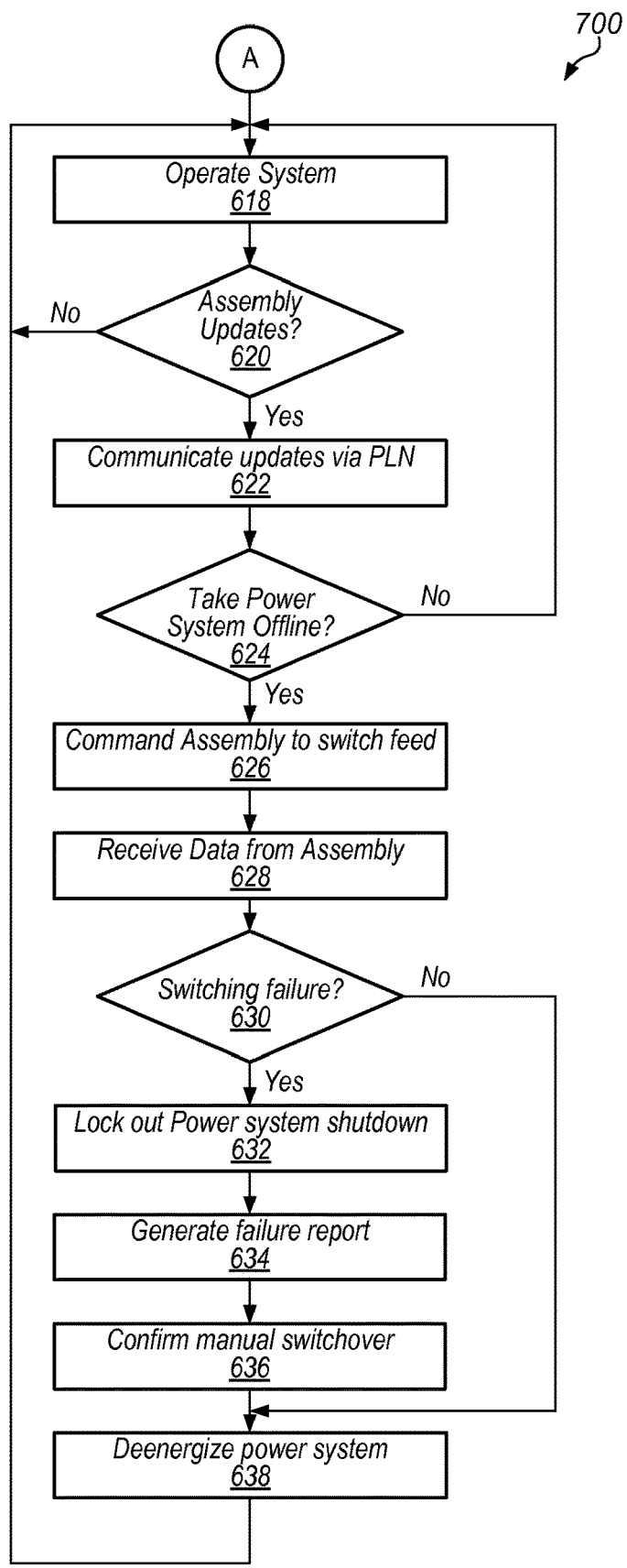
FIG. 7 illustrates managing various systems and components of a power distribution system according to some embodiments.

FIG. 7 illustrates managing various systems and components 700 of a power distribution system according to some embodiments.

At 618, also shown above in FIG. 6, the power distribution is operated as discussed above. At 620, if no updates to one or more portions of the switching assembly are available, the operation continues. If, at 620, updates are available, including one or more updates to one or more aspects of the assembly's firmware, software, etc., such updates may be communicated to the switching assembly at least in part over the power transmission line to which the assembly is communicatively coupled. For example, where the switching assembly is communicatively coupled to a particular power component of an upstream power distribution system over a power transmission line, and the power component is communicatively coupled to an external computer system via a network connection, updates to the assembly's firmware can be communicated to a portion of the power component from the external computer system via the network connection, and the updates can be communicated from the power component to the assembly over the power transmission line.

At 624, a determination may be made whether to take one or more portions of the power distribution system off-line. Power distribution system portions may be taken off-line for various reasons, including maintenance, inspection, replacement, etc. If a portion of a power distribution system is to be taken off-line, as shown at 626, an assembly that is currently routing power from the power distribution system to a downstream electrical load may be commanded to switch to routing power from another power distribution system. In some embodiments, such a command may include commanding the assembly to switch from the power distribution system to a secondary power distribution system to which the assembly is also coupled. The command may be communicated from one or more portions of the power distribution system, including one or more particular power components, to the switching assembly over one or more power transmission lines, based at least in part upon one or more commands received at the power component from an external computer system via one or more network connections.

At 628, data is received from the assembly. Such data may include event logs, system information, diagnostic information, etc. associated with one or more portions of the assembly. Data may include an indication of a failure associated with the assembly. In some embodiments, the data is received at a power component of the power distribution system from the assembly via one or more power transmission lines. The data may also be received at an external computer system from the power component via a network connection.

In some embodiments, an action can be taken in response to data received from one or more assemblies. For example, data that includes event logs, system information, etc. can be archived in a database, monitored to determine trends, etc. Such archiving and monitoring may be performed at an external computer system that receives the data via a network connection. In another example, where the data includes an indication of a failure associated with the assembly, an indication of an occurrence of an event, etc. the action may include generating a message. Such a message may include a report regarding the indication, an alert to an operator regarding the indication, a command to one or more devices to take a particular action in response to the indication, etc. For example, the message may include an alert message for an operator of a data center that includes the assembly to perform an action regarding the assembly, including maintenance, inspection, manual operation, etc. The message may be generated by an external computer system, which may be located remotely from the data center that includes the assembly.

In some embodiments, data is received from an assembly over a power transmission line based at least in part upon a command transmitted to the assembly over a power transmission line, which may be another separate power transmission line. For example, where a command is transmitted to the assembly to switch from the power distribution system to another power distribution system, as discussed above with reference to block 626, the assembly may transmit response data over the power transmission line, where the response data indicates reception of the command and an indication of whether the commanded switching is successfully completed. In some embodiments, the response data may be generated based at least in part upon a portion of the command transmitted to the assembly, based at least in part upon some internal programming of the assembly, etc. The response data may be received and processed by one or more power components, external computer systems, etc. as discussed above. At 630, where the response data is determined, at one or more power components, external computer systems, etc., to indicate successful completion of switching by the assembly based at least in part upon the transmitted command to switch, at least a portion of the power distribution system from which the assembly has switched away is determined to be electrically bypassed by the switching assembly, and at least the portion of the power distribution system is enabled to be de-energized ("powered-down"). Such enabling may include a command transmitted from one or more power components, external computer systems, etc. that receive the response data from the assembly to one or more other power components of the power distribution system, where the command includes an unlocking command that unlocks a capability of each power component to accept a power-down command and power down.

As shown at 632, where the response data indicates that the commanded switching was unsuccessful by the assembly, power-down of one or more portions of the power distribution system is locked out. Such locking out may include transmitting a command from one or more power components, external computer systems, etc. that receive the response data from the assembly to one or more other power components of the power distribution system, where the command includes a locking command that locks each power component from accepting a power-down command and powering down. In another example, such locking out may include declining to transmit an unlocking command that unlocks a capability of each power component to accept a power-down command and power down. At 634, a failure report indicating failure of an assembly to switch power distribution systems is generated. Such a report may be communicated to one or more operators, technicians, etc. so that the switching assembly may be inspected, maintained, etc. In some embodiments, a failure report may include a command to an operator to manually switch the switching assembly. At 636, where confirmation of a manual switching of the switching assembly is received, so that one or more portions of the power distribution system are confirmed to be bypassed, the one or more portions of the power distribution system can be powered down.

Figure 8:
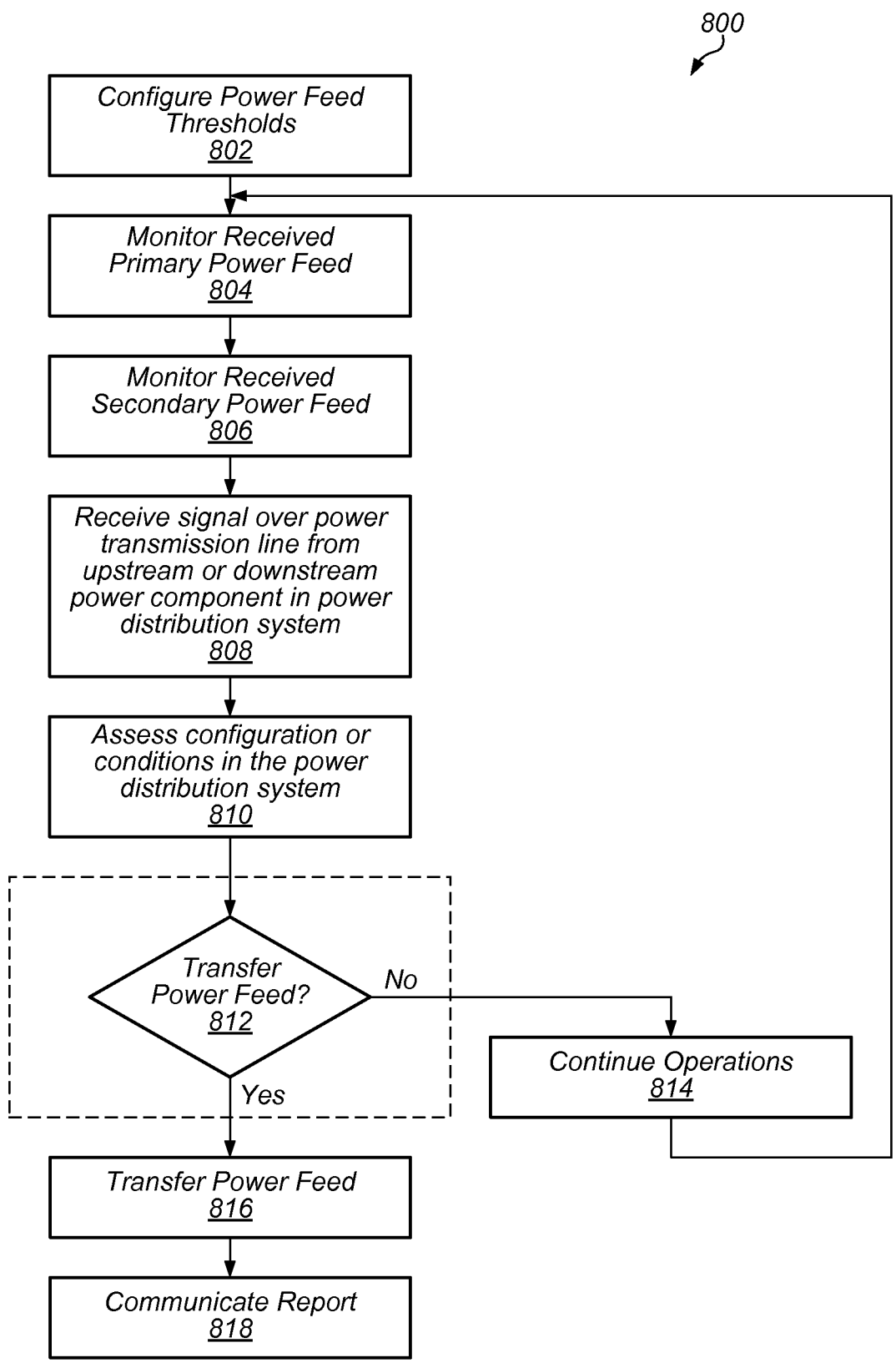
FIG. 8 illustrates assessing a condition of an upstream power distribution system and transferring routed power feeds using signals received from upstream power components in the upstream power distribution system, according to some embodiments.

FIG. 8 illustrates assessing 800 a condition of an upstream power distribution system and transferring routed power feeds using signals received from upstream power components in the upstream power distribution system, according to some embodiments. The assessment may be made at least in part by a switching assembly, including one or more modules included therein. As such modules may be at least partially implemented by one or more computer systems, the assessing may be implemented at least in part by the one or more computer systems. The assessment may be made, for example at a switching assembly, by comparing signals received at the assembly with information stored locally at the assembly, including one or more sets of threshold values.

At 802, one or more sets of threshold values associated with one or more characteristics or conditions associated with one or more portions of a power distribution system are configured. The threshold values may be initially configured at a switching assembly based at least in part upon information communicated to the switching assembly from one or more other sources, including a power component, external computer system, etc. In some embodiments, one or more sets of threshold values may be adjusted to another set of values based at least in part upon data received at the switching assembly. Such data may include data updates communicated to the switching assembly, determinations made based at least in part upon monitoring data signals received at the switching assembly, etc.

At 804, a power feed received at the switching assembly from a primary power system (i.e., a "primary power feed")

over a power transmission line is monitored. Such monitoring may include monitoring one or more characteristics of the power feed, including phase, voltage, current, a waveform thereof as a function of elapsed time, etc. Such characteristics may be measured using one or more measurement devices associated with the switching assembly. For example, with reference to switching assembly 430 of FIG. 4, power module 434 may include a voltmeter that measures voltage of a power feed received over a power transmission line 431 over time.

In some embodiments, one or more measured power feed characteristics are compared against one or more sets of threshold values as a part of determining whether to switch the assembly to another power feed. For example, where the switching assembly monitors primary power feed voltage, the measured voltage may be compared against two threshold values, a high-voltage threshold and a low-voltage threshold, that collectively define a tolerance band of voltages for the power feed. Where the measured voltage at least meets one of the two thresholds, an anomaly may be determined for the power feed. In some embodiments, where a certain anomaly corresponds to a fault condition, the switching assembly may respond to determination of the certain anomaly in the primary power feed by commanding a switching mechanism to switch away from the primary power feed. For example, where the voltage falls below a low-voltage threshold value, the power feed may be determined to be experiencing a voltage-droop anomaly, and a fault condition may be determined for the primary power feed, triggering a command to switch to another power feed. In some embodiments, the "other" power feed includes a secondary power feed from a secondary power distribution system.

At 806, a power feed received at the switching assembly from a secondary power system (i.e., a "secondary power feed") over a power transmission line is monitored. Such monitoring may proceed similarly to monitoring of other power feeds, as discussed above with reference to block 806. In some embodiments, a power feed to which the switching assembly is not switched is monitored as part of determining whether to enable switching to that power feed if a fault condition is determined for another power feed to which the switching assembly is currently switched. For example, where a switching assembly is currently switched to a primary power feed, the switching assembly may measure characteristics of a secondary power feed and, based at least in part upon the measuring, determine whether to enable switching to the secondary power feed if a fault condition is determined for the primary power feed. Where a fault condition is determined for the secondary power feed, the switching assembly may partially or totally preclude switching from the primary power feed to the secondary power feed. Partial preclusion from switching may include adjusting one or more power feed characteristic thresholds for monitoring the primary power feed to increase the "tolerance" of the switching assembly to anomalies in the primary power feed, so that the switching assembly is less sensitive to primary power feed anomalies. In addition, the switching assembly may determine that the secondary power system is already supplying power to one or more electrical loads, such that the secondary power system is supplying more than a certain threshold fraction of its total power supply capacity, and may respond by partially or totally precluding switching to the secondary power system to mitigate the possibility of an overload condition in the secondary power system from multiple loads being switched to the secondary power system unnecessarily.

At 808, one or more signals are received at a portion of the switching assembly over one or more power transmission lines. The signals can include one or more data signals communicated over the power transmission lines by one or more power components of one or more upstream power distribution systems. In some embodiments, one or more of the data signals includes information indicating one or more characteristics or conditions of one or more portions of the power distribution systems. For example, a data signal may include information indicating a current voltage of power supplied by one or more power components in a power system, including a UPS in a primary power system. In another example, data signal information may include one or more "heartbeat" signals that indicates, by its presence or absence, whether one or more characteristics or conditions in the power system at least meet one or more sets of threshold values of the one or more characteristics or conditions. In some embodiments, the data signals are received and processed by one or more portions of the switching assembly to recover the information included in a data signal.

At 810, the configuration or conditions in one or more portions of the power distribution system are assessed based at least in part upon information included in the received data signals. The information may be monitored, instantaneously, over a period of time, etc., to determine whether an anomaly is present in one or more portions of the upstream power system from whence the data signal is received. For example, where the information indicates a current voltage of power supplied by one or more power components in a power system, the indicated voltage may be compared against one or more sets of threshold voltage values to determine, based at least in part upon whether the indicated voltage at least meets one of the threshold values, whether an anomaly is present. Characteristics or conditions indicated in one or more data signals may be tracked over time to determine whether one or more anomalies are present.

At 812, a determination is made whether to transfer the power feed routed to a downstream electrical load from one power feed to another. Such a determination may include determining whether to switch from one power feed to another. For example, where a switching assembly is routing a primary power feed to a load, determination 812 may include a determination of whether to switch from the primary power feed to a secondary power feed supplied to the switching assembly from a secondary power distribution system. As discussed further below, such determination may be based at least in part upon monitoring of one or more power feed characteristics, characteristics or conditions of one or more portions of a power distribution system supplying one or more power feeds, etc.

If, at 814, no transfer is to be made, operations continue. If, at 816, a transfer is to be made, a command is generated for a switching mechanism, which may include an ATS, to switch from the currently-routed power feed to another power feed. At 818, a report documenting the switching may be generated. The report may be communicated over a power transmission line to a power component of a power distribution system, including an upstream component, over a network connection to an external computer system, some combination thereof, or the like.

Figure 9:
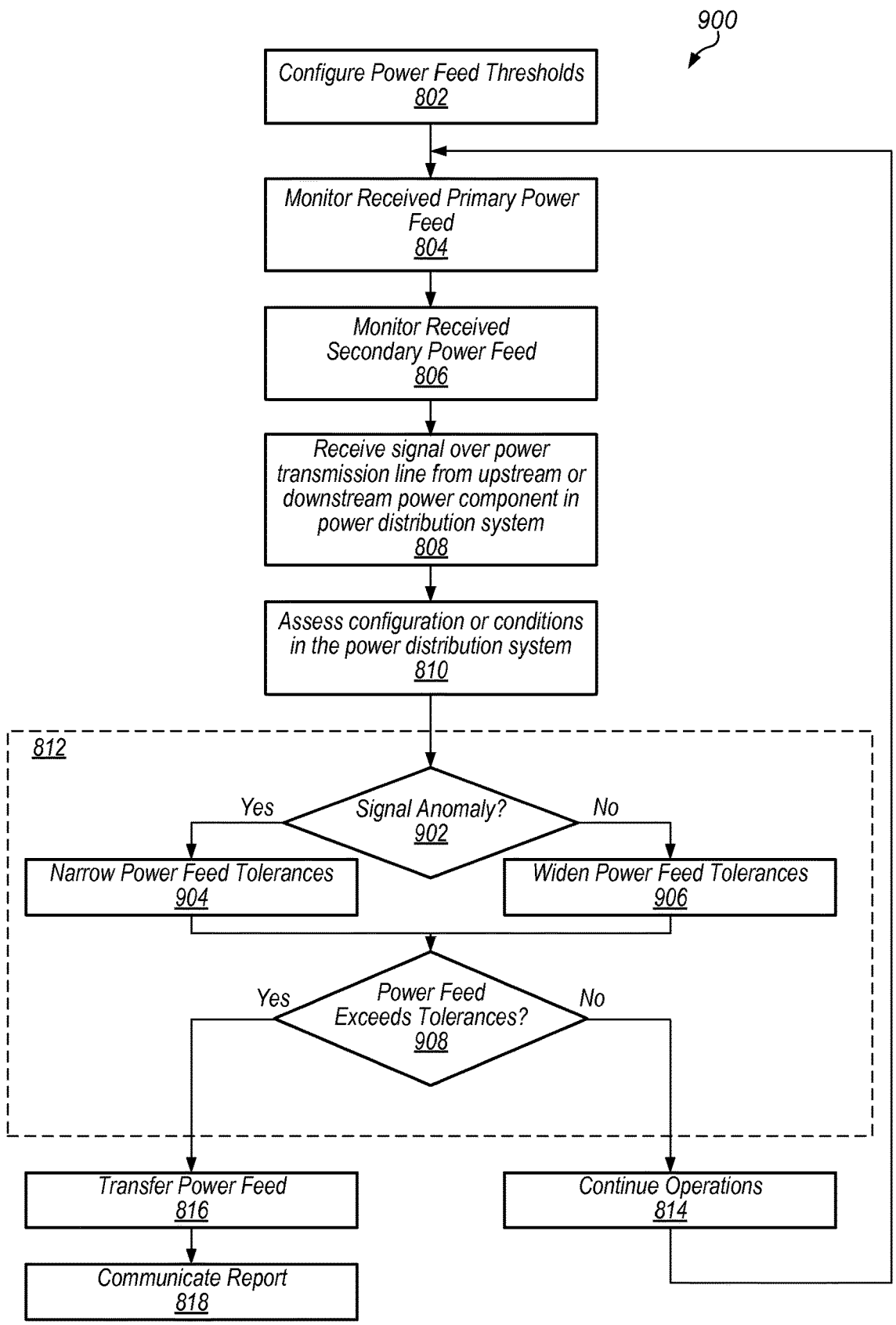
FIG. 9 illustrates assessing a condition of an upstream power distribution system and transferring routed power feeds using signals received from upstream power components in the upstream power distribution system, according to some embodiments.

FIG. 9 illustrates assessing 900 a condition of an upstream power distribution system and transferring routed power feeds using signals received from upstream power components in the upstream power distribution system, according to some embodiments.

As illustrated in FIG. 8 and FIG. 9 at blocks 802-810, one or more power feed characteristics, characteristics or conditions of one or more portions of a power distribution system can be monitored. As illustrated at block 812, a determination can be made whether to transfer the power feed routed to a load. As illustrated at blocks 814-816, operations may continue normally, or a power feed transfer may be commanded, based at least in part upon the determination illustrated at block 812.

In some embodiments, a determination of whether to transfer the power feed routed to a downstream electrical load from one power feed to another includes one or more various determinations that may each be based at least in part upon one or more monitored characteristics or conditions of one or more portions of a power system, power feed characteristics, etc. For example, at 908, a determination can be made whether one or more measured power feed characteristics of a power feed received at a switching assembly over a power transmission line at least meets one or more sets of threshold values. As shown in the illustrated embodiment, where a set of threshold values defines a tolerance band of power feed characteristics values, a determination of whether a measured characteristic meets one of the threshold values in a set includes a determination of whether the characteristic exceeds the tolerance band defined by the set of threshold values.

In some embodiments, a determination of whether to transfer the power feed routed to a downstream electrical load from one power feed to another is based at least in part upon one or more characteristics or conditions of one or more portions of a power distribution system that are monitored based at least in part upon receipt and processing of one or more data signals over a power transmission line. As discussed in further detail above, data signals may be received at a switching assembly from a power component of a power distribution system over a power transmission line, and the data signals may be processed, and the information included therein monitored, to determine the one or more characteristics or conditions indicated by the information.

Where the one or more characteristics or conditions are determined to indicate an anomaly in at least a portion of a power distribution system, for example where an indicated characteristic has a value that at least meets one or more sets of threshold values for that condition, the switching assembly may determine whether to transfer the power feed based at least in part upon the determination. For example, in some embodiments, the switching assembly may determine that the power feed is to be transferred as indicated at 816, where an anomaly is determined at 902. In some embodiments, including the illustrated embodiment, determination of an anomaly based at least in part upon data signal monitoring influences adjustment of power feed characteristic thresholds used to determine whether the power feed exceeds tolerances. As shown at 904 and 906, one or more sets of power feed characteristic threshold values may be adjusted to narrow or widen one or more tolerance bands defined by the thresholds based upon respective determined presence or absence of an anomaly based on data signal monitoring at 902. The adjusted threshold values may be used, at 908, to determine whether a power feed characteristic of a power feed exceeds one or more of the tolerance bands, upon which the power feed may be transferred at 816 if so.

In some embodiments, where data signals are received from one or more power distribution systems over one or more power transmission lines, anomalies associated with a given power distribution system may result in adjustment of power feed characteristic thresholds for analysis of the particular power feed received from that given power distribution system. For example, a determined anomaly in a primary power system, based at least in part upon monitoring data signals including information indicating one or more characteristics or conditions of one or more portions of the primary power system, may result in adjustment of one or more sets of threshold values against which a measure power feed characteristic of a primary power feed from the primary power system is compared to determine whether an anomaly is present in the primary power feed. In some embodiments, anomalies associated with a given power distribution system may result in adjustment of power feed characteristic thresholds for analysis of the particular power feed received from another power distribution system. For example, a determined anomaly in a secondary power system, based at least in part upon monitoring data signals including information indicating one or more characteristics or conditions of one or more portions of the secondary power system, may result in adjustment of one or more sets of threshold values against which a measure power feed characteristic of a primary power feed from the primary power system is compared to determine whether an anomaly is present in the primary power feed.

In various embodiments described above, power monitoring is carried out for computing systems (for example, servers) in a data center. Nevertheless, monitoring may be carried out for power distribution to any type of electrical system. Examples include hospital equipment, utility systems, security systems, military systems, telecommunications systems, or electronic commerce systems. In certain embodiments, power distribution monitoring is carried out for a critical system, such as a life support system.

Figure 10:
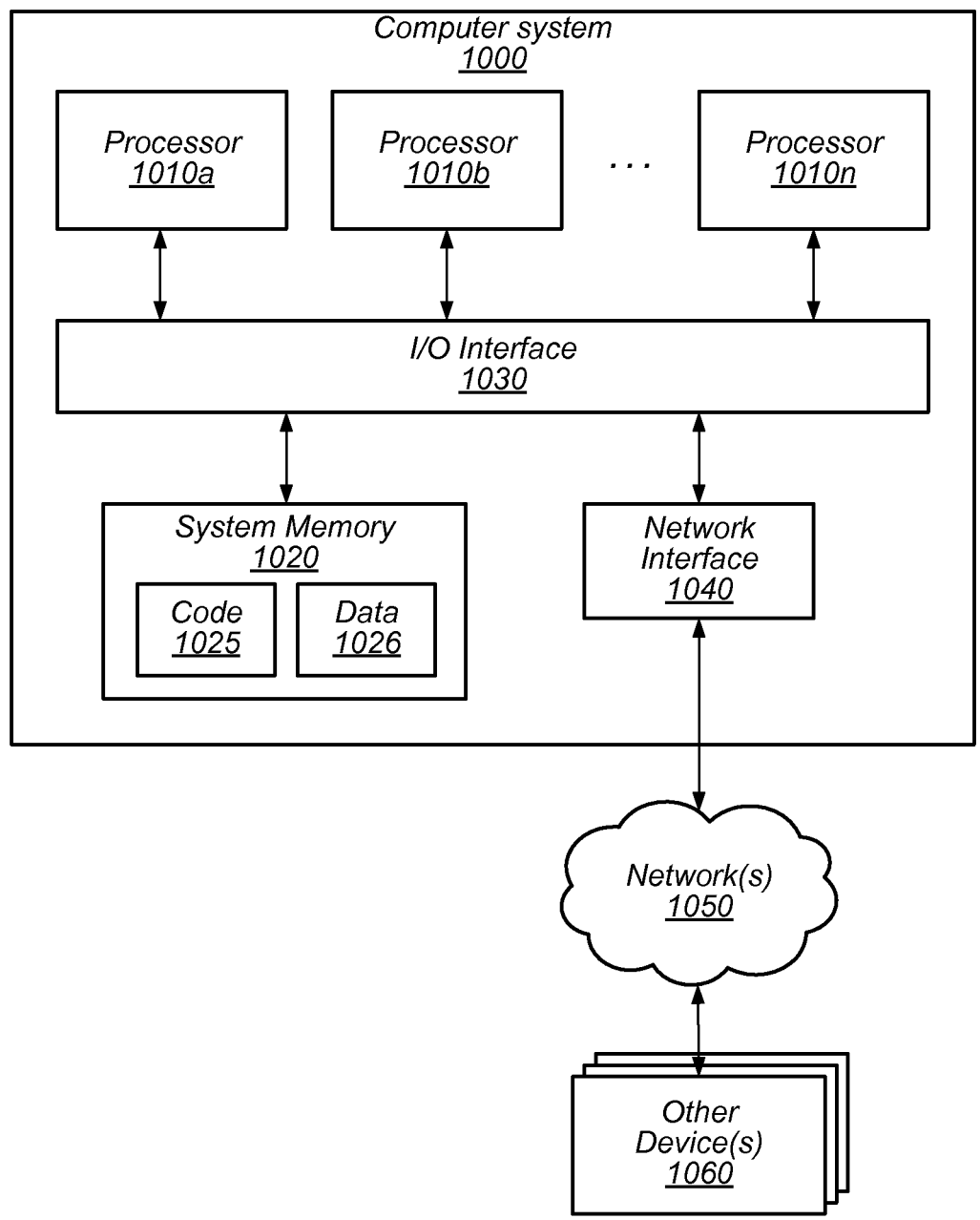
FIG. 10 is a block diagram illustrating an example computer system that may be used in some embodiments.

FIG. 10 is a block diagram illustrating an example computer system that may be used in some embodiments.

In some embodiments, a system that implements a portion or all of one or more of the technologies, including but not limited to a portion or all of the power distribution systems, one or more power components included in the power distribution systems, and various power management methods, systems, devices, and apparatuses as described herein, may include a general-purpose computer system that includes or is configured to access one or more computer-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of one or more of the technologies, including but not limited to a portion or all of the power distribution systems, one or more power components included in the power distribution systems, and various power management methods, systems, devices, and apparatuses as described herein, are shown stored within system memory 1020 as code 1025 and data 1026.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices as illustrated in FIGS. 1 through 10, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a computer-accessible medium configured to store program instructions and data for implementing embodiments of power management methods as described above relative to FIGS. 1-9. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc, as well as transmission media or signals such as electrical, electromagnetic, or digital signals, conveyed via a communication medium such as network and/or a wireless link.

In various embodiments described above, power components include modules or devices for both sending and receiving signals to other power components in a power distribution system. Power components, nevertheless, may, in various embodiments, include devices only for sending signals to other power components, or only for receiving signals from other power components.

In many of the embodiments described above, signals are exchanged among power components in a power distribution system over power transmission lines between the power components. Signals may, nevertheless, may, in certain embodiments, be exchanged between power components using other mediums, such as network signals exchanged by way of a fiber optic connection.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   one or more sets of computer systems;
   a primary power system coupled to, and configured to provide a primary power feed to the one or more sets of computer systems, the primary power system comprising at least one power component configured to:
      distribute the primary power feed to the one or more sets of computer systems via a power transmission line; and
      generate one or more data signals and transmit the one or more data signals over the power transmission line to a switching assembly, wherein the one or more data signals transmitted from the at least one power component over the power transmission line to the switching assembly indicate values for one or more of a voltage, current, temperature, or power phase at the at least one power component that distributes the primary power feed to the switching assembly via the power transmission line;
   a secondary power system configured to provide a secondary power feed to the one or more sets of computer systems; and
   the switching assembly configured to:
      process the one or more data signals received at the switching assembly from the primary power system over the power transmission line to recover information indicating one or more of the voltage, current, temperature, or power phase at the at least one power component; and
      switch from routing the primary power feed to the one or more sets of computer systems to routing the secondary power feed to the one or more sets of computer systems based at least in part upon a comparison of the one or more of the voltage, current, temperature or power phase at the at least one power component to a threshold value.

2. The data center of claim 1, wherein:
to switch from the primary power feed to the secondary power feed, the switching assembly is configured to:
monitor a power feed characteristic of the primary power feed received over the power transmission line;
process the received one or more data signals to monitor a power component characteristic via data signals received over the power transmission line; and
based at least in part upon monitoring both the power feed characteristic and the power component characteristic, determine whether to switch from the primary power feed to the secondary power feed.

3. The data center of claim 2, wherein to determine whether to switch from the primary power feed to the secondary power feed, the switching assembly is configured to:
based at least in part on the monitoring of the power component characteristic, adjust a threshold value for the power feed characteristic to one of a plurality of predetermined values; and
in response to determining that the power feed characteristic exceeds the adjusted threshold value, command a switching mechanism of the switching assembly to switch from the primary power feed to the secondary power feed.

4. The data center of claim 1, comprising:
a computer system configured to communicate with at least a portion of the switching assembly over the power transmission line, wherein the computer system is configured to:
command the switching assembly to switch from the primary power feed to the secondary power feed;
in response to receiving an indication from the switching assembly of successful completion of the switching, power down the at least one power component; and
in response to receiving an indication of a failure to complete the switching, preclude the powering down of the at least one power component.

5. An apparatus, comprising:
a switching controller device configured to receive power from an upstream power component of a power system over a power transmission line, the switching controller device comprising:
a transceiver module configured to receive a data signal transmitted from the power component of the power system over the power transmission line to the switching controller device, wherein the data signal is generated at the upstream power component and indicates values for one or more of a voltage, current, temperature, or power phase at the upstream power component that distributes the power to the switching controller device via the power transmission line;
an analysis module configured to process the received data signal to recover information indicating one or more of the voltage, current, temperature, or power phase at the upstream power component; and
a controller module configured to command a switching mechanism to selectively route power received over the power transmission line to a downstream computer system based at least in part upon a comparison of the one or more of the voltage, current, temperature or power phase at the upstream power component to a threshold value.

6. The apparatus of claim 5, wherein:
the information indicates a current condition of a portion of the power system;
to process the received data signal, the analysis module is configured to monitor the current condition of the portion of the power system to determine whether the current condition at least meets a threshold condition;
the analysis module is further configured to monitor a power feed characteristic of power received at the switching controller device over the power transmission line to determine whether the power feed characteristic at least meets a power feed threshold value; and
to command the switching mechanism to selectively route power, the switching controller device is configured to respond to a determination at the analysis module that the current condition at least meets the threshold condition and the power feed characteristic at least meets the power feed threshold value.

7. The apparatus of claim 6, wherein:
to determine whether the power feed characteristic at least meets a power feed threshold value, the analysis module is configured to, based at least in part upon a determination that the current condition of the portion of the power system at least meets the threshold condition, adjust the power feed threshold value to one of a plurality of values; and
the controller module is configured to command the switching mechanism to selectively route power based at least in part upon a determination, at the analysis module, that the power feed characteristic at least meets the adjusted power feed threshold value.

8. The apparatus of claim 7, wherein:
to adjust the power feed threshold value to one of a plurality of values, the controller module is configured to adjust the power feed threshold value from a particular threshold value to another threshold value based at least in part upon the determination that the current condition of the portion of the power system at least meets the threshold condition; and
wherein the particular threshold value has a different value than the other threshold value.

9. The apparatus of claim 8, wherein:
the information associated with at least the portion of the power system comprises a heartbeat signal indicating that the current condition of the portion of the power system at least meets a predetermined threshold condition; and
the threshold condition includes a determination, at the analysis module, that the heartbeat signal is absent from power received over the power transmission line.

10. The apparatus of claim 9, wherein:
the controller module is further configured to, subsequent to adjusting the power feed threshold value from the particular threshold value to the other threshold value, adjust the power feed threshold value from the other threshold value to the particular threshold value based at least in part upon a determination, at the analysis module, of a subsequently resumed reception of the heartbeat signal over the power transmission line.

11. The apparatus of claim 5, wherein:
the switching controller device is configured to interpose an electrical power connection between the upstream power system and the switching mechanism, wherein power received from the upstream power system over the power transmission line is routed through the switching controller device to the switching mechanism via a power connection;

the switching controller device is communicatively coupled to the switching mechanism via a network cable connection from the switching controller device to a network interface of the switching mechanism; and to command a switching mechanism to selectively route power received over the power transmission line to a downstream computer system, the controller module is configured to transmit a command signal to a portion of the switching mechanism via the network cable connection.

12. The apparatus of claim 5, wherein:

the data signal includes a command received from a remote computer system over the power transmission line; and the switching controller device is configured to command an override of at least a portion of firmware associated with the switching mechanism based at least in part on the received command.

13. The apparatus of claim 5, wherein the switching controller device is configured to communicate data regarding one or more aspects of the switching controller device to the upstream power component of the power system over the power transmission line.

14. A method, comprising:

performing, by a computing device configured to route power received from an upstream power system over a power transmission line to a downstream electrical load:

receiving a data signal transmitted from a portion of the upstream power system over the power transmission line to the computing device, wherein the data signal is generated at the portion of the upstream power system and indicates values for one or more of a voltage, current, temperature, or power phase at the portion of the upstream power system that distributes the power to the downstream electrical load via the power transmission line;

processing the data signal to determine information indicating a current condition of the portion of the upstream power system, wherein the current condition comprises one or more of a voltage, current, temperature or power phase at the portion of the upstream power system; and based at least in part upon a comparison of the one or more of the voltage, current, temperature or power phase at the portion of the upstream power system to a threshold value, commanding a switching mechanism to selectively route power received over the power transmission line to the downstream electrical load.

15. The method of claim 14, wherein:

the method further comprises monitoring at least one power feed characteristic of the power received over the power transmission line to determine whether the power feed characteristic at least meets a power feed threshold value;

processing the data signal to determine the current condition of the portion of the upstream power system comprises determining whether the current condition at least meets a threshold condition; and commanding a switching mechanism to selectively route power received over the power transmission line to the downstream electrical load comprises commanding the switching mechanism to selectively route power based at least in part on the determined current condition at least meeting the threshold condition and the power feed characteristic at least meets the power feed threshold value.

16. The method of claim 15, wherein:

determining whether the current condition at least meets a threshold condition comprises adjusting the power feed threshold value to one of a plurality of values based at last in part upon a determination that the current condition of the portion of the upstream power system at least meets the threshold condition; and monitoring at least one power feed characteristic of the power received over the power transmission line to determine whether the power feed characteristic at least meets a power feed threshold value comprises determining whether the power feed characteristic at least meets the adjusted power feed threshold value.

17. The method of claim 16, wherein:

adjusting the power feed threshold value to one of a plurality of values comprises adjusting the power feed threshold value from a particular threshold value to another threshold value based at least in part upon the determination that the current condition of the portion of the upstream power system at least meets the threshold condition, wherein the particular threshold value has a different value than the other threshold value; and the method further comprises, subsequent to adjusting the power feed threshold value to the other threshold value, adjusting the power feed threshold value from the other threshold value to the particular threshold value based at least in part upon a subsequent determination that the current condition of the portion of the upstream power system has subsequently ceased to at least meet the threshold condition.

18. The method of claim 14, wherein:

the data signal comprises a heartbeat signal indicating whether the current condition of the portion of the upstream power system at least meets a predetermined threshold condition.

19. The method of claim 14, further comprising:

based at least in part upon an occurrence of an event local to the computing device, transmitting a message regarding the occurrence to an upstream power component of the upstream power system over the power transmission line.

20. The method of claim 19, further comprising:

receiving another data signal from the upstream power system over the power transmission line, wherein the other data signal includes a command generated based at least in part upon the transmitted message regarding the occurrence of the event local to the computing device; and commanding an override of at least a portion of firmware associated with the switching mechanism based at least in part on the received command.

* * * * *